United States Patent
Shinbashi et al.

(10) Patent No.: US 10,635,528 B2
(45) Date of Patent: Apr. 28, 2020

(54) MEMORY CONTROLLER AND METHOD OF CONTROLLING MEMORY CONTROLLER

(71) Applicant: SONY CORPORATION, Tokyo (JP)

(72) Inventors: Tatsuo Shinbashi, Tokyo (JP); Lui Sakai, Kanagawa (JP); Ryoji Ikegaya, Kanagawa (JP)

(73) Assignee: SONY CORPORATION, Tokyo (JP)

(*) Notice: Subject to any disclaimer, the term of this patent is extended or adjusted under 35 U.S.C. 154(b) by 241 days.

(21) Appl. No.: 15/323,574

(22) PCT Filed: May 20, 2015

(86) PCT No.: PCT/JP2015/064448
§ 371 (c)(1),
(2) Date: Jan. 3, 2017

(87) PCT Pub. No.: WO2016/013285
PCT Pub. Date: Jan. 28, 2016

(65) Prior Publication Data
US 2017/0147433 A1    May 25, 2017

(30) Foreign Application Priority Data
Jul. 24, 2014 (JP) ................ 2014-150637

(51) Int. Cl.
*G11C 29/52* (2006.01)
*G06F 11/10* (2006.01)
(Continued)

(52) U.S. Cl.
CPC ...... *G06F 11/1068* (2013.01); *G06F 11/1012* (2013.01); *G06F 12/16* (2013.01); *G11C 29/52* (2013.01); *G11C 2029/0411* (2013.01)

(58) Field of Classification Search
CPC .. G06F 11/1012; G06F 12/16; G06F 11/1068; G11C 29/52; G11C 2029/0411
(Continued)

(56) References Cited

U.S. PATENT DOCUMENTS 5,805,615 A * 9/1998 Chen ............... H03M 13/151
714/757
7,395,489 B2 * 7/2008 Itou ................. G06F 11/1064
714/764
(Continued)

FOREIGN PATENT DOCUMENTS

JP    2009-230796 A    10/2009
JP    2010-218447 A     9/2010
(Continued)

*Primary Examiner* — Albert Decady
*Assistant Examiner* — Enam Ahmed
(74) *Attorney, Agent, or Firm* — Chip Law Group

(57) ABSTRACT

A utilization efficiency of a memory is improved. A codeword generation unit generates a codeword in an error detection and correction code from data to be encoded. A write control unit writes one of data obtained by inverting the codeword and the codeword into the memory cell as write data. A read data error correction unit reads out the write data from the memory cell as read data, and corrects an error in the read data. An inversion data error correction unit corrects an error in inversion data obtained by inverting the read data. A correction data output unit, when the number of errors of either only one of the read data and the inversion data does not exceed an error correction capability of the error detection and correction code, selects and outputs the one where the error is corrected as correction data.

8 Claims, 21 Drawing Sheets

(51) Int. Cl.
*G06F 12/16* (2006.01)
*G11C 29/04* (2006.01)

(58) Field of Classification Search
USPC .......................................................... 714/764
See application file for complete search history.

(56) References Cited

U.S. PATENT DOCUMENTS

| | | | | |
|---|---|---|---|---|
| 9,432,298 | B1* | 8/2016 | Smith ................. | H04L 49/9057 |
| 2008/0270675 | A1* | 10/2008 | Nagaraj .............. | G06F 12/0246 |
| | | | | 711/100 |
| 2009/0172496 | A1* | 7/2009 | Roine ................. | G06F 11/1008 |
| | | | | 714/758 |
| 2012/0017136 | A1* | 1/2012 | Ordentlich .......... | G06F 11/1028 |
| | | | | 714/763 |
| 2013/0097473 | A1* | 4/2013 | Tanaka ................ | G06F 11/1008 |
| | | | | 714/764 |
| 2015/0212877 | A1* | 7/2015 | Kern ................... | G11C 7/1006 |
| | | | | 714/764 |
| 2015/0254136 | A1* | 9/2015 | Hoya .................. | G06F 11/1012 |
| | | | | 714/764 |

FOREIGN PATENT DOCUMENTS

| | | |
|---|---|---|
| JP | 2011-141914 A | 7/2011 |
| JP | 2013-239142 A | 11/2013 |

* cited by examiner

| Correction success and failure bit Br | Correction success and failure bit Br' | Select bit | Error flag |
|---|---|---|---|
| 0 (Read data correction failure) | 0 (Inversion data correction failure) | 0/1 | 1 (Read error) |
| 0 (Read data correction failure) | 1 (Inversion data correction success) | 1 (Correction inversion data output) | 0 |
| 1 (Read data correction success) | 0 (Inversion data correction failure) | 0 (Correction read data output) | 0 |
| 1 (Read data correction success) | 1 (Inversion data correction success) | 0/1 | 1 (Read error) |

FIG.7

MEMORY CONTROLLER AND METHOD OF CONTROLLING MEMORY CONTROLLER

CROSS REFERENCE TO RELATED APPLICATIONS

This application is a U.S. National Phase of International Patent Application No. PCT/JP2015/064448 filed on May 20, 2015, which claims priority benefit of Japanese Patent Application No. JP 2014-150637 filed in the Japan Patent Office on Jul. 24, 2014. Each of the above-referenced applications is hereby incorporated herein by reference in its entirety.

TECHNICAL FIELD

The present technology relates to a memory controller and a method of controlling a memory controller, in particularly to a memory controller and a method of controlling a memory controller that perform an error correction.

BACKGROUND ART

In a recent information processing system, a non-volatile memory (NVM: Non-Volatile memory) may be used as an auxiliary storage or a storage. The non-volatile memory is roughly classified into a flash memory corresponding to a data access in a large size unit and a non-volatile random access memory (NVRAM: Non-Volatile RAM) that allows random access at a high speed in a small unit. A representative example of the flash memory include a NAND type flash memory. On the other hand, an example of the non-volatile random access memory includes a ReRAM (Resistance RAM), a PCRAM (Phase-Change RAM), a MRAM (Magnetoresistive RAM) and the like.

In some of the non-volatile memories, one value of a binary bit is rewritten and the other value of the binary bit is then rewritten in odder in write processing. Generally, in the non-volatile memory (for example, ReRAM), the higher the number of bits to be written is, the greater a maximum value of a power consumption in the rewriting is. A semiconductor apparatus has been proposed that data including a lower number of the bit to be rewritten is selected from inversion data inverted and data not inverted, and is written into a non-volatile memory in order to reduce the maximum power consumption, (see Patent Literature 1, for example).

CITATION LIST

Patent Literature

Patent Literature 1: Japanese Patent Application Laid-open No. 2010-218447

DISCLOSURE OF INVENTION

Technical Problem

The above-described semiconductor apparatus in the related art generates an inversion bit showing whether or not data is inverted upon writing, and writes data before inversion or an inversion bit together with inversion data into a non-volatile memory. Then, the semiconductor apparatus refers the inversion bit upon reading out the data, and inverts the read-out data when it is inverted upon writing. Thus, in the semiconductor apparatus in the related art, it is necessary to write extra inversion bits into the non-volatile memory. As there are the extra inversion bits, a utilization efficiency of the non-volatile memory is undesirably lowered.

The present technology is generated in view of the circumstances, and an object is to improve a utilization efficiency of a memory.

Solution to Problem

The present technology is made to solve the above-described problems. A first aspect is a memory controller, including a codeword generation unit that generates a codeword in an error detection and correction code from data to be encoded; a write control unit that writes one of data obtained by inverting the codeword and the codeword into the memory cell as write data; a read data error correction unit that reads out the write data from the memory cell as read data, and corrects an error in the read data; an inversion data error correction unit that corrects an error in inversion data obtained by inverting the read data; and a correction data output unit that, when the number of errors of either only one of the read data and the inversion data does not exceed an error correction capability of the error detection and correction code, selects and outputs the one where the error is corrected as correction data, and a control method. This produces an effect that, when the number of errors of either only one of the read data and the inversion data does not exceed an error correction capability of the error detection and correction code, the one where the error is corrected is output as correction data.

In the first aspect, the read data error correction unit may include a non-inverted side syndrome calculation unit that calculates a product of the read data and a predetermined check matrix as a syndrome, and a non-inverted side error location correction unit that detects the error location on the basis of the syndrome, and corrects the location of the detected error in the read data, and the inversion data error correction unit may include an inversion compensation unit that compensates the syndrome by adding a compensation factor that is a difference between the product of the inversion data and the predetermined check matrix and the syndrome, an inverted side error location correction unit that detects the error location from the compensated syndrome, and corrects the location of the detected error in the read data, and an inversion unit that inverts the read data where the error is corrected by the inverted side error location correction unit. This produces an effect that the syndrome is compensated by adding a compensation factor.

In the first aspect, the read data error correction unit may detect the error location on the basis of the product of the read data and the predetermined check matrix, and correct the detected error location in the read data, and the inversion data error correction unit may detect the error location on the basis of the product of the inversion data and the predetermined check matrix, and correct the detected error location in the inversion data. This produces an effect that the error location detected on the basis of the product of the read data and the predetermined check matrix is corrected in the read data, and the error location detected on the basis of the product of the inversion data and the predetermined check matrix is corrected in the inversion data.

In the first aspect, the write control unit may write one of data obtained by inverting the codeword and the codeword as the write data, the one having a lower power consumption when writing into the memory cell. This produces an effect that one of data obtained by inverting the codeword and the codeword, the one having a lower power consumption when writing, is written into the memory cell, as the write data.

In the first aspect, the write control unit may write the codeword as the write data when the number of bits having a predetermined value in the codeword is greater than a half of a total number of bits of the codeword, and write data obtained by inverting the codeword as the write data when the number of bits having a predetermined value in the codeword does not exceed a half of the total number of bits of the codeword. This produces an effect that the data obtained by inverting the codeword is written as the write data, when a number of bits having a predetermined value in the codeword is greater than a half of a total number of bits of the codeword.

In the first aspect, when both of the number of errors of the read data and the number of errors of the inversion data do not exceed the error correction capability, one of correction read data where the error is corrected and correction inversion data where the error is corrected, the one having the greater number of bits having a predetermined value, may be output as the correction data. This produces an effect that, when both of the number of errors of the read data and the number of errors of the inversion data do not exceed the error correction capability, one of the correction read data and the correction inversion data, the one having the greater number of bits having a predetermined value, may be output.

In the first aspect, when both of the number of errors of the read data and the number of errors of the inversion data do not exceed the error correction capability, one of correction read data where the error is corrected and correction inversion data where the error is corrected, the one having a lower number of errors corrected, may be output as the correction data. This produces an effect that, when the number error of both of the read data and the inversion data does not exceed the error correction capability, one of the correction read data and the correction inversion data, the one having a lower number of errors corrected, may be output.

In the first aspect, when both of the number of errors of the read data and the number of errors of the inversion data do not exceed the error correction capability, and when the number of errors corrected in the correction read data and the number of errors of the correction inversion data are the same, one of the correction read data and the correction inversion data, the one having the greater number of bits having a predetermined value, may be output as the correction data. This produces an effect that, when both of the number of errors of the read data and the number of errors of the inversion data do not exceed the error correction capability, and when the number of errors corrected of the correction read data and the number of errors of the correction inversion data are the same, the one having the greater number of bits having a predetermined value is output.

Advantageous Effects of Invention

According to the present technology, an excellent effect that the utilization efficiency of the memory is achievable. It should be noted that the effect described here is not necessarily limitative and may be any effect described in the present disclosure.

BRIEF DESCRIPTION OF DRAWINGS

FIG. 7 is a table showing an example of an action of a correction data selection unit in a first embodiment.

MODE(S) FOR CARRYING OUT THE INVENTION

Hereinafter, a mode for carrying out the present technology (hereinafter referred to as an embodiment) will be described. The description will be described in the following order.

1. First Embodiment (example of outputting correction succeeded data of read data and inversion data)

2. Second Embodiment (example of outputting correction succeeded data of read data and inversion data after inversion compensation)

1. First Embodiment

[Configuration Example of Information Processing System]

Figure 1:
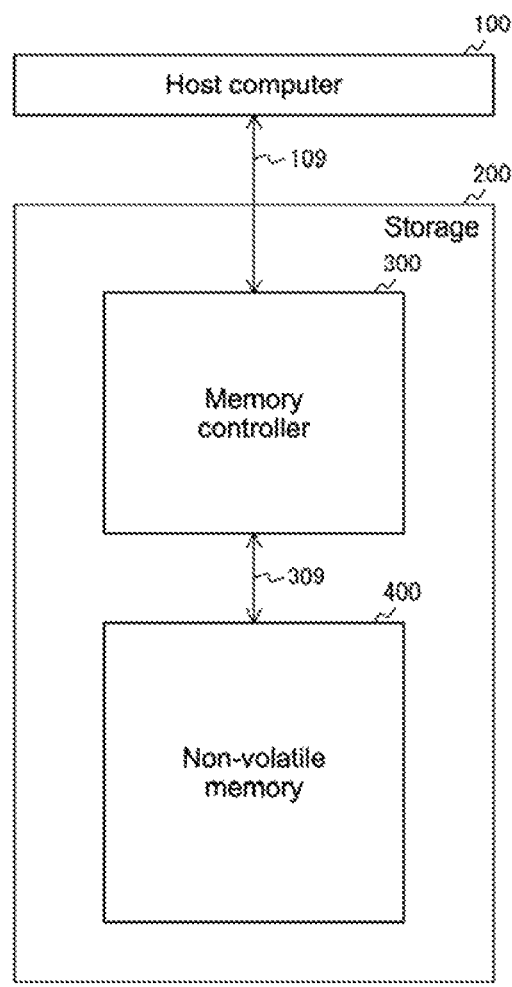
FIG. 1 is a block diagram showing a configuration example of an information processing system in a first embodiment.

FIG. 1 is a block diagram showing a configuration example of an information processing system in a first embodiment. The processing system includes a host computer 100 and a storage 200.

The host computer 100 controls a whole information processing system. Specifically, the host computer 100 generates a command and data, which are fed to the storage 200 via a signal line 109. Also, the host computer 100 receives data read out from the storage 200. Here, the command is to control the storage 200, and includes a write command for instructing data writing or a read command for instructing data reading out.

The storage 200 includes a memory controller 300 and a non-volatile memory 400. The memory controller 300 controls the non-volatile memory 400. When the memory controller 300 receives the write command and the data from the host computer 100, the error detection and correction code (ECC) is generated from the data. Specifically, the memory controller 300 converts (i.e., encodes) the data into a codeword including the data and a parity. The memory controller 300 accesses the non-volatile memory 400 via a signal line 309, and writes the encoded data.

Also, when the read command is received from the host computer 100, the memory controller 300 accesses the non-volatile memory 400 via the signal line 309, and reads out the encoded data. Then, the memory controller 300 converts (i.e., decodes) the encoded data into original data before encoding. In addition, the memory controller 300 performs data error detection and correction on the basis of the ECC. The memory controller 300 feeds the correction data to the host computer 100.

The non-volatile memory 400 stores data according to the control by the memory controller 300. For example, a ReRAM is used as the non-volatile memory 400. The non-volatile memory 400 includes a plurality of memory cells, and the memory cells are divided into a plurality of blocks. Here, the block is an access unit of the non-volatile memory 400, and is also called as a sector. A memory address is assigned to each block. Instead of the ReRAM, a flash memory, a PCRAM, and, an MRAM may be used as the non-volatile memory 400.

[Configuration Example of Memory Controller]

Figure 2:
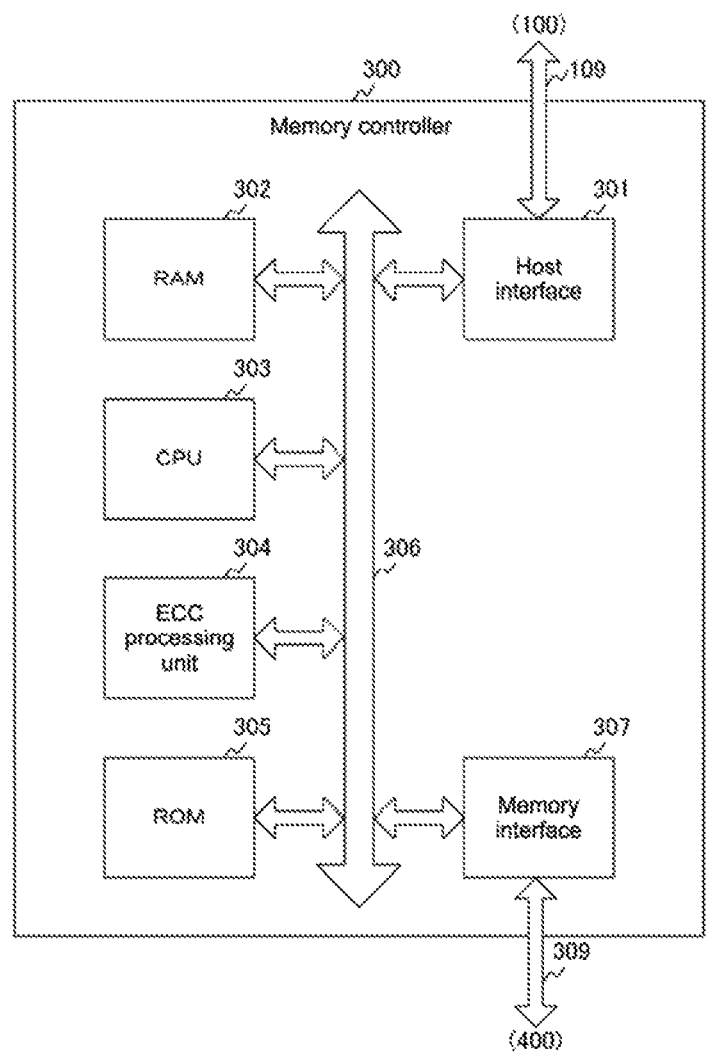
FIG. 2 is a block diagram showing a specific configuration example of a memory controller in a first embodiment.

FIG. 2 is a block diagram showing a configuration example of the memory controller 300 in a first embodiment. The memory controller 300 includes a RAM (Random Access Memory) 302, a CPU (Central Processing Unit) 303, an ECC processing unit 304 and a ROM (Read Only Memory) 305. Also, the memory controller 300 includes a host interface 301, a bus 306, and memory interface 307.

The RAM 302 temporarily holds the data necessary in the processing executed by the CPU 303. The CPU 303 controls overall of the memory controller 300. The ROM 305 stores a program, etc. executed by the CPU 303. The host interface 301 interchange the data or the command with the host computer 100. The bus 306 is a common path for interchanging the data by the RAM 302, the CPU 303, the ECC processing unit 304, the ROM 305, the host interface 301, and the memory interface 307. The memory interface 307 interchanges the data or the command with the non-volatile memory 400.

The ECC processing unit 304 encodes the data to be encoded, and decodes the encoded data. Upon encoding the data, the ECC processing unit 304 encodes the data to be encoded in a predetermined unit by adding a parity. Each data encoded in the predetermined unit is hereinafter referred to as a "codeword". Then, the ECC processing unit 304 feeds the encoded data to the non-volatile memory 400 as write data via the bus 306.

Also, the ECC processing unit 304 decodes the encoded read data to the original data. Upon decoding, the ECC processing unit 304 detects and corrects the codeword error using the parity. The ECC processing unit 304 feeds the decoded original data to the host computer 100 via the bus 306.

[Configuration Example of Memory Controller]

Figure 3:
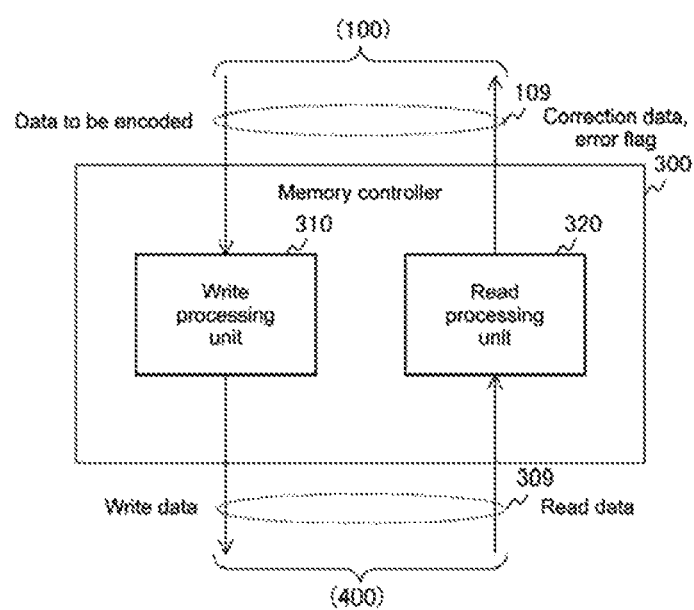
FIG. 3 is a block diagram showing a functional configuration example of a memory controller in a first embodiment.

FIG. 3 is a block diagram showing a functional configuration example of the memory controller 300 in a first embodiment. The memory controller 300 includes a write processing unit 310 and a read processing unit 320. The write processing unit 310 in FIG. 3 is realized by the RAM 302, the CPU 303, the ECC processing unit 304, the ROM 305, the host interface 301, the bus 306, the memory interface 307, etc. in FIG. 2. The same is applied to the read processing unit 320.

The write processing unit 310 executes processing that write data is written into the non-volatile memory 400 in accordance with a write command. When the write command and the data to be encoded are received from the host computer 100, the write processing unit 310 encodes the data to be encoded to a codeword. Upon encoding, the data to be coded is encoded into a binary BCH code, for example. Upon encoding to the BCH code, a generating polynomial by the following expression 1, for example.

[Math. 1]

$$G(x)=\text{LCM}[M_1(x), M_2(x), \ldots, M_{2t}(x)] \quad \text{Ex. 1}$$

In expression 1, LCM[ ] represents a least common polynomial in each polynomial within [ ]. $M_i(x)$ is a minimal polynomial of $\alpha^i$ where a primitive element on a Galois field GF $(2^q)$ is $\alpha$.

The write processing unit 310 generates a code polynomial expression from the data to be encoded, and determines a remainder of the code polynomial expression divided by the generating polynomial shown in the expression 1. The code polynomial expression is a polynomial expression having a factor of each bit value of the data to be encoded. The write processing unit 310 generates the data including each determined remainder factor as a parity, and outputs the codeword including the data to be encoded and the parity to the non-volatile memory 400 as write data.

Note that the write processing unit 310 may perform encoding not by the polynomial operation using the generating polynomial expression, but by a matrix operation. In addition, the write processing unit 310 encodes the data to be encoded to a binary BCH code, but may encode to a code other than the BCH code so long as the code has an error correction capability. The write processing unit 310 may encode to an RS (Reed-Solomon) code or a convolutional code, for example. Also, the write processing unit 310 may encode to a code in a higher dimension than binary.

The read processing unit 320 executes processing for reading out the read data from the non-volatile memory 400 according to the read command. When the read command is received from the host computer 100, the read processing unit 320 reads out the codeword as the read data from a memory address designated by the command. The read processing unit 320 decodes the read data to the original data. Upon decoding, the read processing unit 320 corrects an error in the read data using the parity included in the read data. An error correction method will be described later in detail. The read processing unit 320 outputs the error correction data to the host computer 100. Also, the read processing unit 320 generates an error flag on the basis of success or failure of the error correction, and outputs the error flag to the host computer 100.

[Configuration Example of Write Processing Unit]

Figure 4:
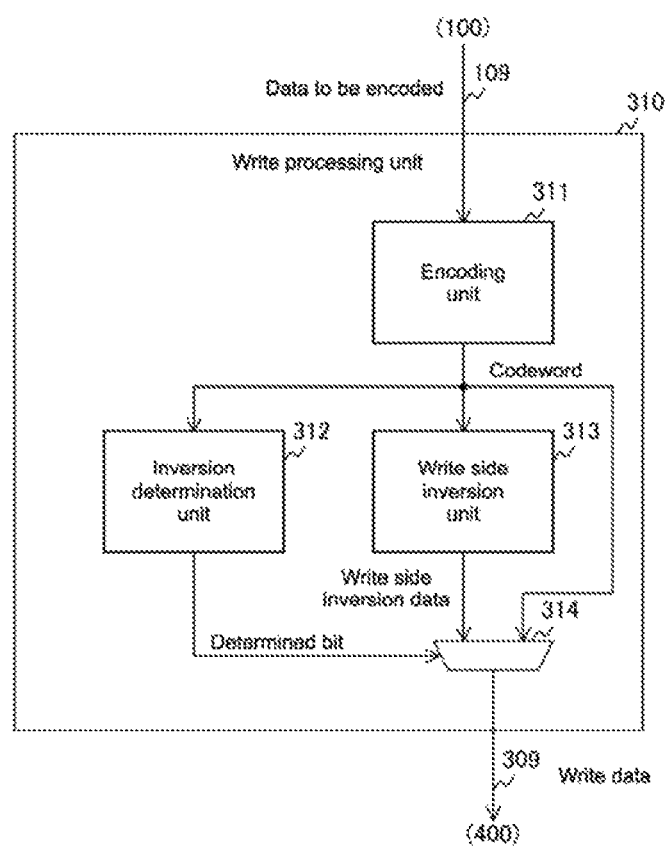
FIG. 4 is a block diagram showing a configuration example of a write processing unit in a first embodiment.

FIG. 4 is a block diagram showing a configuration example of the write processing unit 300 in a first embodiment. The write processing unit 310 includes an encoding unit 311, an inversion determination unit 312, a write side inversion unit 313, and a selector 314.

The encoding unit 311 encodes the data to be encoded to the codeword in accordance with the write command using the generating polynomial of the expression 1. The encoding unit 311 feeds the codeword to the inversion determination unit 312, the write side inversion unit 313, and the selector 314. Note that the encoding unit 311 is an example of a codeword generation unit described in the scope of claims.

The inversion determination unit 312 determines which has a lower power consumption of the codeword and the inversion data upon writing to the non-volatile memory 400. The inversion determination unit 312 determines whether or not the bit having a specific value (for example, "1") in the codeword is a multiple bit having the number of bits greater than a half of a total number of bits n of the codeword, for example. When the "1" bit is the multiple bit, the inversion determination unit 312 generates a determination bit for designating the codeword. If not, it generates the determination bit for designating inversion data.

When the "1" bit is not the multiple bit, the inversion data is written. In the write data, "0" number of bits is always not more than a half of the total number of bits n. Accordingly, a changed number of bits will be always not more than n/2 in reset processing that rewrites "1" to "0" and in set processing that rewrites "0" to "1" in the non-volatile memory 400. Accordingly, a maximum value of the power consumption in the write processing of the non-volatile memory 400 will be decreased.

The write side inversion unit 313 inverts the codeword. The write side inversion unit 313 feeds the inverted codeword to the selector 314 as write side inversion data.

The selector 314 selects one of the codeword and write side inversion data in accordance with the determination bit. The selector 314 feeds the selected data to the non-volatile memory 400 as the write data. Note that the selector 314 is an example of a write control unit described in the scope of claims.

Although the write processing unit 310 selects the data to be written by determining whether or not the bit having a specific value is the multiple bit, the configuration is not limited thereto. For example, the write processing unit 310 may read out data from the write address, compare with the codeword and the write side inversion data in a bit unit, and write the one including a lower number of the bit to be rewritten as the write data, as described in Patent Literature 1.

Figure 5A:
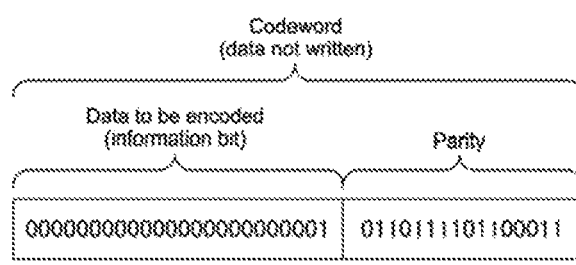
FIGS. 5a and 5b are diagrams showing a codeword and write side inversion data in a first embodiment.
Figure 5B:
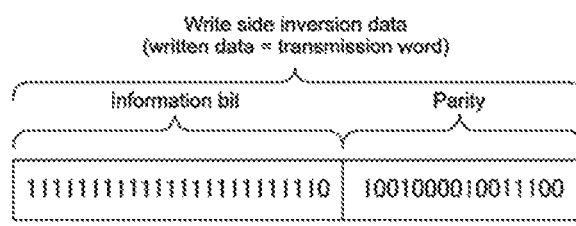

FIGS. 5a and 5b are diagrams showing examples of the codeword and the write side inversion data in a first embodiment. "5a" in the same figure is a diagram showing an example of the codeword. For example, in a (40, 24) code, a 16 bit parity is generated from 24 bits write data, and a 40 bit codeword including the same is generated. In the codeword, "1" number of bits is "11" and 40/2 or less. Accordingly, "1" is not the multiple bit. "5b" in the same figure is a diagram showing an example of the write side inversion data obtained by inverting the "5a" codeword in the same figure. As described above, as "1" in the codeword is not the multiple bit, the write side inversion data is written into the non-volatile memory 400 as the write data.

Figure 6:
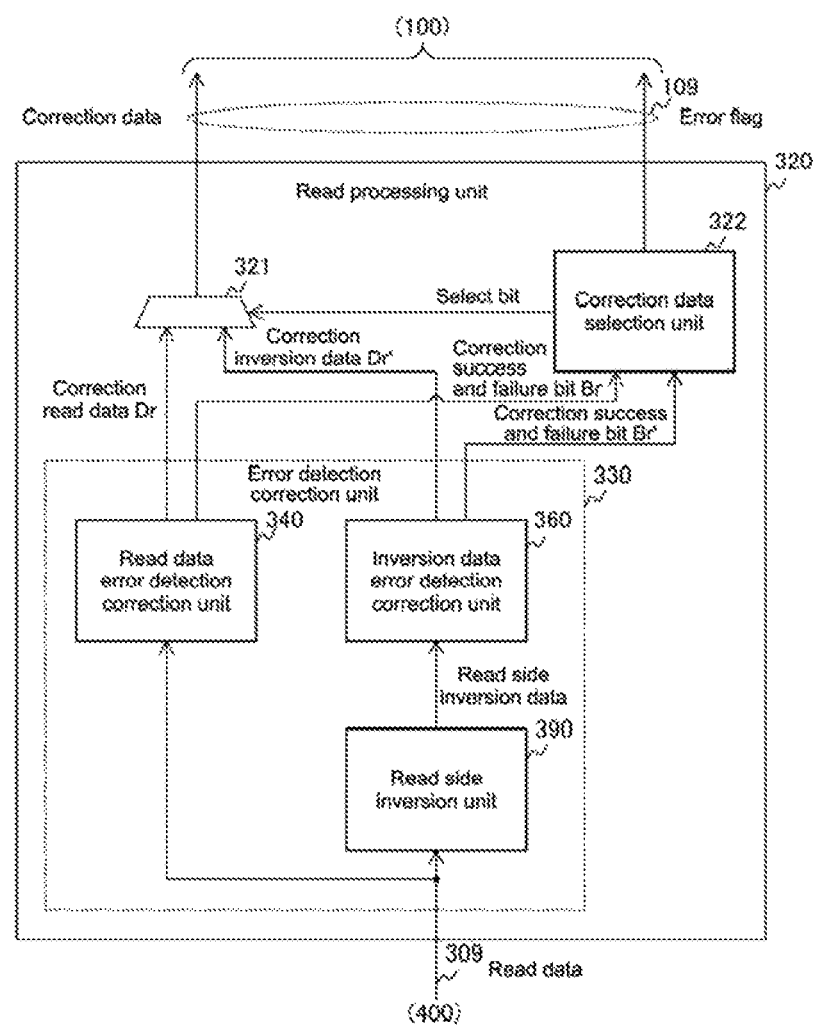
FIG. 6 is a block diagram showing a configuration example of a read processing unit in a first embodiment.

FIG. 6 is a block diagram showing a configuration example of the read processing unit 320 in a first embodiment. The read processing unit 320 includes a selector 321, a correction data selection unit 322 and an error detection correction unit 330. Also, the error detection correction unit 330 includes a read data error detection correction unit 340, an inversion data error detection correction unit 360 and a read side inversion unit 390.

The read side inversion unit 390 reads out read data from the non-volatile memory 400 in accordance with a read command, and inverses the read data. The read side inversion unit 390 feeds the inverted read data to the inversion data error detection correction unit 360 as read side inversion data.

The read data error detection correction unit 340 reads out the read data from the non-volatile memory 400 in accordance with the read command, and performs error detection and error correction of the read data. The read data error detection correction unit 340 generates a correction success or failure bit Br showing whether or not the error correction is succeeded on the basis of the results of the error detection and the error correction. Here, when no error is detected, the error correction itself is not performed. In this case, it regards that the error correction is succeeded, for convenience of the description. To the correction success or failure bit Br, a value "1" is set when the error correction is succeeded, and a value "0" is set when the error correction is failed.

When the error correction is succeeded, the read data error detection correction unit 340 feeds the data provided by removing the parity from the read data after error correction to the selector 321 as correction read data Dr. Also, the read data error detection correction unit 340 generates the correction success or failure bit Br that notifies that the error correction is succeeded, and feeds to the correction data selection unit 322.

Here, the number of errors exceeds a correction capability of the ECC, the error correction may be failed. In this case, the read data error detection correction unit 340 generates the correction success or failure bit Br that notifies that the error correction is failed, and feeds to the correction data selection unit 322. Note that the read data error detection correction unit 340 is an example of a read data error correction unit described in the scope of claims.

The inversion data error detection correction unit 360 performs error detection and error correction of the inversion data. The inversion data error detection correction unit 360 generates a correction success or failure bit Br' showing whether or not the error correction of the inversion data is succeeded.

When the error correction is succeeded, the inversion data error detection correction unit 360 feeds the data provided by removing the parity from the inversion data after the error correction to the selector 321 as correction inversion data Dr'. Also, the inversion data error detection correction unit 360 generates the correction success or failure bit Br' that notifies that the error correction is succeeded, and feeds to the correction data selection unit 322.

On the other hand, when the error correction is failed, the inversion data error detection correction unit 360 generates the correction success or failure bit Br' that notifies that the error correction is failed, and feeds to the correction data selection unit 322. Note that the inversion data error detection correction unit 360 is an example of an inversion data error correction unit described in the scope of claims.

When the error correction of only one of the read data and the inversion data is succeeded, the correction data selection unit 322 selects the succeeded data. When the error correction of only the read data is succeeded, the correction data selection unit 322 selects the correction read data Dr. When the error correction of only the inversion data is succeeded, the correction data selection unit 322 selects the correction inversion data Dr'. Then, the correction data selection unit 322 generates a select bit showing the selected one, feeds to the selector 321, generates an error flag notifying that no read error is generated, and outputs the error flag to the host computer 100. To the select bit, when the read data Dr is selected, the value "0" is set, and when the inversion data Dr' is selected, the value "1" is set, for example. To the error flag, when the read error is not generated, the value "0" is set, and when the read error is generated, the value "1" is set.

When the error corrections of both of the read data and inversion data are failed, the correction data selection unit 322 generates the error flag notifying that the read error is generated, and outputs the error flag to the host computer 100.

When the error corrections of both of the read data and inversion data are succeeded, the correction data selection unit 322 generates the error flag notifying that the read error is generated, and outputs to the host computer 100. The reason why the successes of both of the error corrections are handled as the read error is that the number of errors may exceed the correction capability, and it could not determine which data is correct.

The selector 321 outputs one of the correction data Dr and the correction inversion data Dr' as the correction data to the host computer 100 in accordance with the select bit. Note that the selector 321 is an example of a correction data output unit described in the scope of claims.

Note that the read processing unit 320 may be configured to output the data before correction to the host computer 100 upon the read error. In this case, the read processing unit 320 outputs at least one of the read data before correction and the read side inversion data to the host computer 100, for example. Then, the host computer 100 performs the data error correction by an algorithm having the error correction capability higher than a decoding algorithm used by the memory controller 300, for example. As the decoding algorithm having a lower correction capability, a Min-Sum algorithm in a soft decision decoding algorithm is used, for example. As the decoding algorithm having a higher correction capability, a BP (Brief-Propagation) algorithm is used, for example.

In addition, although the read data error detection correction unit 340 outputs the data removing the parity as the correction data Dr, the read data after correction may be output as it is by not removing the parity. The same applies to the inversion data error detection correction unit 360.

FIG. 7 is a table showing an example of an action of the correction data selection unit 322 in a first embodiment. When both of the correction success or failure bit Br and Br' are "0", i.e., when the corrections of both of the read data and the read side inversion data are failed, the correction data selection unit 322 generates an error flag of "1" showing that there is the read error. In this case, the select bit may be any of "0" and "1".

When only the correction success or failure bit Br' is "1", i.e., the correction of only the read side inversion data is succeeded, the correction data selection unit 322 generates a select bit "1" showing the correction inversion data Dr'. Also, the correction data selection unit 322 generates an error flag "0" showing that there is no read error.

When only the correction success or failure bit Br is "1", i.e., the correction of only the read data is succeeded, the correction data selection unit 322 generates a select bit "0" showing the correction read data Dr. Also, the correction data selection unit 322 generates the error flag of "0" showing that there is no read error.

When both of the correction success or failure bit Br and Br' are "1", i.e., when the corrections of both of the read data and the read side inversion data are succeeded, the correction data selection unit 322 generates the error flag of "1" showing that there is the read error. In this case, the select bit may be any of "0" and "1".

Figures 8A, 8B:
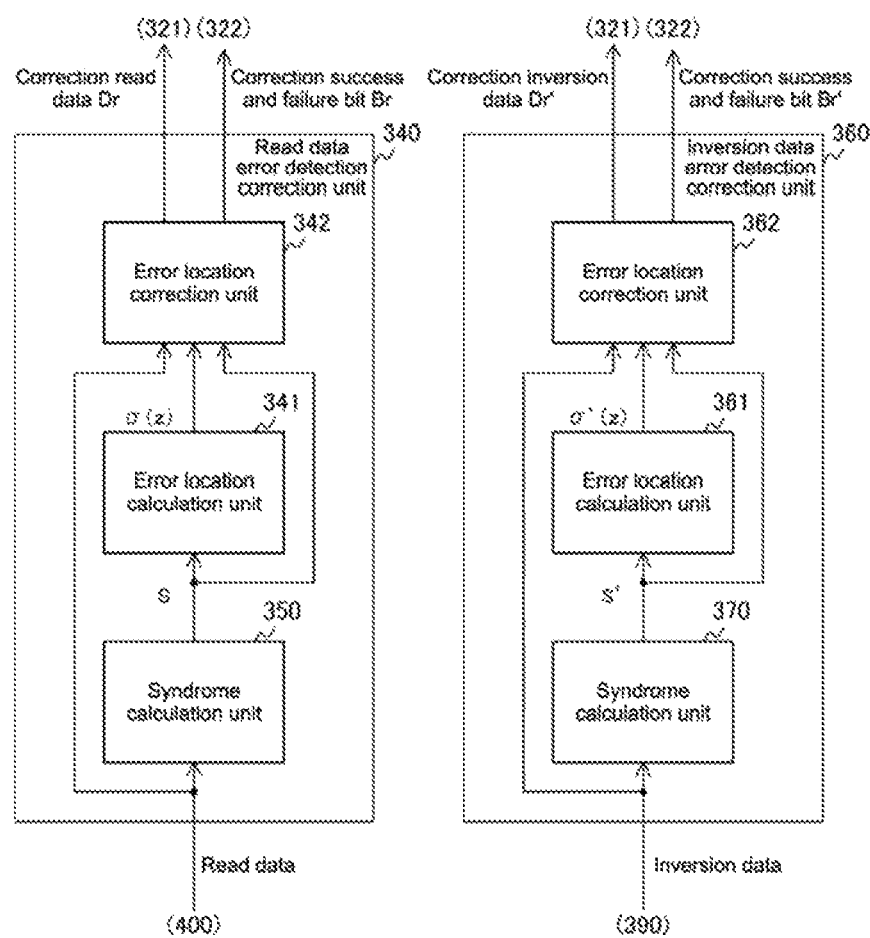
FIGS. 8a and 8b are block diagrams showing configuration examples of a read data error detection correction unit and an inversion data error detection correction unit in a first embodiment.

FIGS. 8a and 8b are block diagrams showing configuration examples of the read data error detection correction unit 340 and the inversion data error detection correction unit 360 in a first embodiment. The read data error detection correction unit 340 includes a syndrome calculation unit 350, an error location calculation unit 341 and an error location correction unit 342. Also, the inversion data error detection correction unit 360 includes a syndrome calculation unit 370, an error location calculation unit 361 and an error location correction unit 362.

The syndrome calculation unit 350 calculates a syndrome from the read data. The syndrome is a vector provided by multiplying a received word (i.e., read data) by a check matrix, and is used to determine an error location.

Here, when a codeword in a shortened code is represented by "c", an error pattern is represented by "e", and a received word including "e" is represented by "r", there are represented by the following expressions:

[Math. 2]

$$c=(c_{n-1},c_{n-2},\ldots,c_1,c_0) \quad \text{Ex. 2}$$

[Math. 3]

$$e=(e_{n-1},e_{n-2},\ldots,e_1,e_0) \quad \text{Ex. 3}$$

[Math. 4]

$$r=c+e=(r_{n-1},r_{n-2},\ldots,r_1,r_0) \quad \text{Ex. 4}$$

Operation to determine the syndrome is represented by the following expression, for example:

[Math. 5]

$$S = H \cdot r \rightarrow \begin{pmatrix} S_1 \\ S_3 \\ \vdots \\ S_{2t-1} \end{pmatrix} = \begin{pmatrix} \alpha^{(n-1)\cdot 1} & \ldots & \alpha^1 & 1 \\ \alpha^{(n-1)\cdot 3} & \ldots & \alpha^3 & 1 \\ \vdots & \ldots & & \\ \alpha^{(n-1)\cdot(2t-1)} & \ldots & \alpha^{2t-1} & 1 \end{pmatrix} \begin{pmatrix} r_{n-1} \\ \vdots \\ r_1 \\ r_0 \end{pmatrix} \quad \text{Ex. 5}$$

In the above expression, H represents the check matrix, S represents the syndrome. In addition, a represents the primitive element of GF ($2^q$), and t represents an integer of 1 or more.

The syndrome calculation unit 350 feeds a syndrome S calculated using the expression 5 to the error location calculation unit 341 and the error location correction unit 342.

The error location calculation unit 341 calculates an error location polynomial expression for calculating the error location on the basis of the syndrome. The error location calculation unit 341 generates an error location polynomial expression of the following expression 6 and an error location evaluation polynomial expression of the following expression 7, for example.

[Math. 6]

$$\sigma(z) = (1 - \alpha^{j1}z)(1 - \alpha^{j2}z)...(1 - \alpha^{jL}z) \quad \text{Ex. 6}$$

[Math. 7]

$$\omega(z) = \sum_{i=1}^{L} e_i \alpha^{ji} \prod_{\substack{k=1 \\ k \neq i}} (1 - \alpha^{jk} z) \quad \text{Ex. 7}$$

In the expressions 6 and 7, j1 to jL represent error locations. When the number of the error locations, i.e., the number of errors, are the error correction capability or less, the error correction is succeeded.

From a root of the expression 6, the error location is determined. In addition, from the expression 7, a value in the error location is determined.

The error location calculation unit 341 firstly generates a polynomial expression S (x) represented by the following expression on the basis of the syndrome.

[Math. 8]

$$S(x) = S_1 x + S_2 x^2 + \ldots + S_{2t-1} x^{2t-1} + S_{2t} x^{2t} \quad \text{Ex. 8}$$

Here, odd order factors $S_1, S_3, \ldots, S_{2t-1}$ are provided by the expression 5. Also, even order factors $S_2, S_4, \ldots, S_{2t}$ are calculated from the odd order factor by the following expression:

[Math. 9]

$$S_2 = S_1^2, S_4 = S_2^2 = S_1^4, S_6 = S_3^2, \ldots \quad \text{Ex. 9}$$

Next, the error location calculation unit 341 calculates δ(x) and ω(x) satisfying the expressions 10 to 13. They can be determined by the Peterson method or the Euclidian method. When the calculation is succeeded, δ(x) and ω(x) are called as an error location polynomial expression and an error location evaluation polynomial expression, which satisfy the expressions 6 and 7.

[Math. 10]

$$\omega(x) = S(x)\sigma(x) \bmod x^{2t} \quad \text{Ex. 10}$$

In the above expression, A mod B means a remainder provided by subtracting A with B.

[Math. 11]

$$\left. \begin{array}{l} \deg \sigma(z) \leq t \\ \deg m(z) \leq t - 1 \end{array} \right\} \quad \text{Ex. 11}$$

[Math. 12]

$$LCM[\omega(z), \sigma(z)] = \text{Constant} \quad \text{Ex. 12}$$

[Math. 13]

$$\sigma(0) = 1 \quad \text{Ex. 13}$$

In the expression 11, degA(z) represents a maximum order of a polynomial expression A(z).

When there is no error location polynomial expression and no error location evaluation polynomial expression satisfying the conditions, the number of errors exceeds the error correction capability, and it is therefore determined that the error correction is failed. In this case, the failure of the error correction is notified to the error location correction unit 342.

On the other hand, when there are the error location polynomial expression and the error location evaluation polynomial expression satisfying the expressions 11 to 13, the error location calculation unit 341 feeds them to the error location correction unit 342.

The error location correction unit 342 corrects the error of the error location within the read data. When all components $S_i$ of the syndrome are "0", the error location correction unit 342 determines that there is no error, generates the correction success or failure bit Br showing that the error correction is succeeded, and outputs the Br to correction data selection unit 322. Also, the error location correction unit 342 outputs the data provided by removing the parity from the read data before correction to the selector 321 as the correction read data Dr.

On the other hand, when all components $S_i$ of the syndrome are not "0", the error location correction unit 342 determines the root of the error location polynomial expression, and detects j1 to jL corresponding to the root as the error location.

When L error locations are successfully detected, the error location correction unit 342 generates the correction success or failure bit Br showing that the error correction is succeeded, and outputs the Br to the correction data selection unit 322. Also, the error location correction unit 342 corrects the read data error by inverting each bit at the detected error location. Then, the error location correction unit 342 outputs the data provided by removing the parity from the read data after correction to the selector 321 as the correction read data Dr.

When there is no error location polynomial expression satisfying the conditions in the expression 11, or when the detection of the L error locations is failure, the error location correction unit 342 generates the correction success or failure bit Br showing that the error correction is failure, and outputs the Br to the correction data selection unit 322.

Furthermore, when a BCH code having a higher order than binary is used, a value of the symbol at the location needs to be determined in addition to the error location. In this case, the value of the symbol is determined by the following expressions 14 and 15, for example.

[Math. 14]

$$e_i = -\frac{\omega(\alpha^{-ji})}{\sigma'(\alpha^{-ji})}, i = 1, \ldots, L \quad \text{Ex. 14}$$

[Math. 15]

$$\sigma'(z) = -\sum_{i=1}^{L} \alpha^{ji} \prod_{\substack{k=1 \\ k \neq i}}^{L} (1 - \alpha^{jk} z) \quad \text{Ex. 15}$$

The syndrome calculation unit 370 calculates a syndrome S' from the inversion data. The configuration of the syndrome calculation unit 370 is similar to those of the syndrome calculation unit 350.

The error location calculation unit 361 calculates the error location polynomial expression form the syndrome S'. The configuration of the error location calculation unit 361 is similar to those of the error location calculation unit 341.

The error location correction unit 362 corrects the error at the error location within the inversion data. The configuration of the error location correction unit 362 is similar to those of the error location correction unit 342 except that correction inversion data Dr' is generated instead of the correction read data Dr, and a correction success or failure bit Br' is generated instead of the correction success or failure bit Br.

[Configuration Example of Syndrome Calculation Unit]

Figure 9:
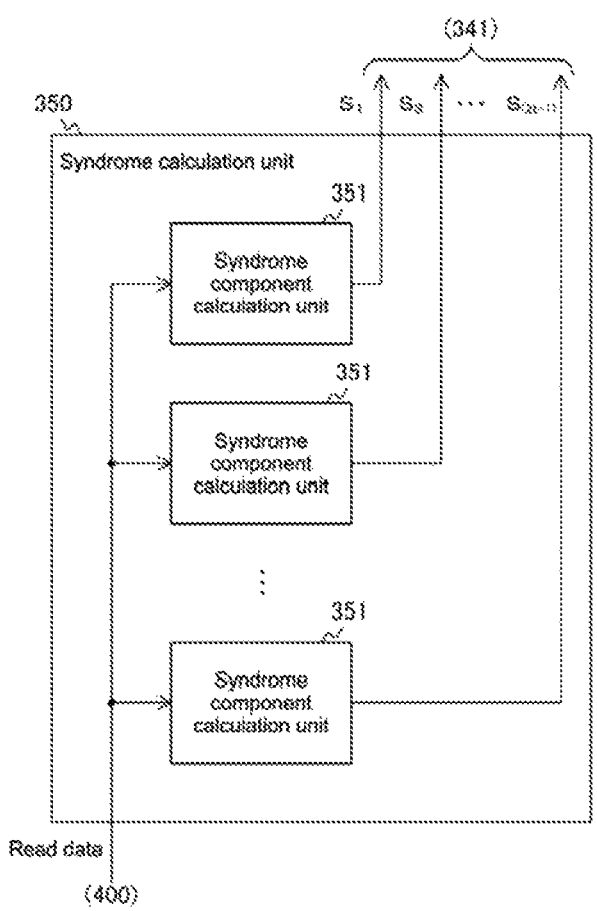
FIG. 9 is a block diagram showing a configuration example of a syndrome calculation unit in a first embodiment.

FIG. 9 is a block diagram showing a configuration example of the syndrome calculation unit 350 in a first embodiment. The syndrome calculation unit 350 includes t syndrome component calculation units 351. The t-th syndrome component calculation unit 351 generates the component $S_i$ in the expression 5, and feeds to the error location calculation unit 341 and the like.

Figure 10A:
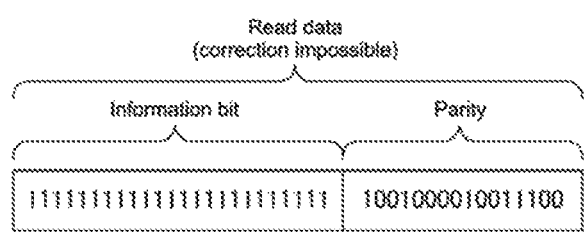
FIGS. 10a, 10b and 10c are diagram showing examples of read data and read side inversion data in a first embodiment.
Figure 10B:
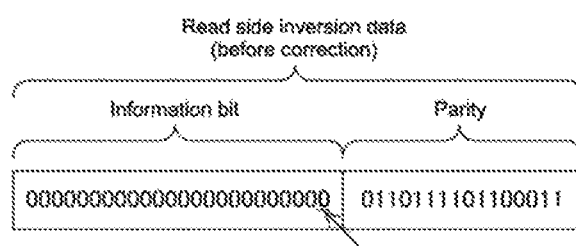
Figure 10C:
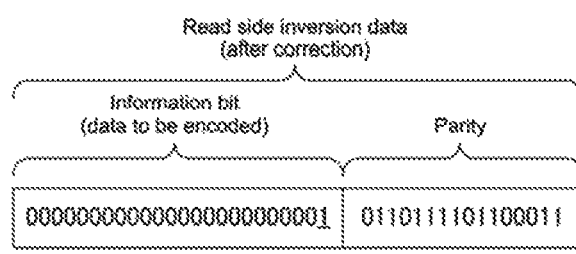

FIGS. 10a, 10b and 10c are diagram showing examples of the read data and the read side inversion data in a first embodiment. "10a" in the same figure is a diagram showing an example of the read data when the inversion data is written by the write processing unit 310. "10b" in the same figure is a diagram showing an example of the read side inversion data obtained by inverting the "10a" read data in the same figure. "10c" in the same figure is a diagram showing an example of the data by correcting the read side inversion data "10b" in the same figure.

As shown in FIGS. 10a, 10b and 10c, when the inversion data is written, the error correction is generally not succeeded in the read processing unit 320, if the read data is not inverted. Accordingly, the read processing unit 320 succeeds the error correction of only the read side inversion data. Then, the read side inversion data where the error is corrected is output to the host computer 100.

[Configuration Example of Non-Volatile Memory]

Figure 11:
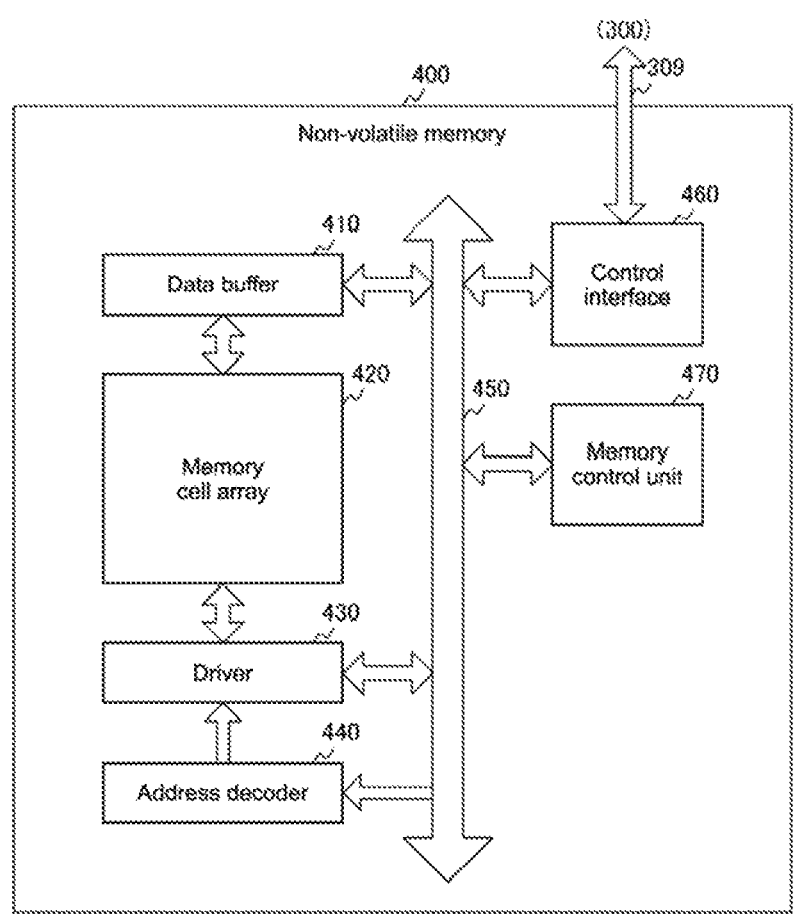
FIG. 11 is a block diagram showing a configuration example of a non-volatile memory in a first embodiment.

FIG. 11 is a block diagram showing a configuration example of the non-volatile memory 400 in a first embodiment. The non-volatile memory 400 includes a data buffer 410, a memory cell array 420, a driver 430, an address decoder 440, a bus 450, a control interface 460, and a memory control unit 470.

The data buffer 410 holds write data and read data in an access unit in accordance with the memory control unit 470. The memory cell array 420 includes a plurality of memory cells arrayed in a matrix. As each memory cell, a non-volatile storage element is used. Specifically, a NAND type or NOR type flash memory, a ReRAM, a PCRAM or an MRAM is used as the storage element.

The driver 430 performs data writing or data reading out to a memory cell selected by the address decoder 440. The address decoder 440 analyses the address designated by the command, and selects the memory cell corresponding to the address. The bus 450 is a common path for interchanging data by the data buffer 410, the memory cell array 420, the address decoder 440, the memory control unit 470 and the control interface 460. The control interface 460 is an interface that the memory controller 300 interchanges the data and the command with the non-volatile memory 400.

The memory control unit 470 controls the driver 430 and the address decoder 440 to write or read-out the data. When the write command and the write data are received, the memory control unit 470 reads out the data written into the address designated by the command as written data. The read out is called as pre-read. The memory control unit 470 compares the write data with the written data in a bit unit. An object to be rewritten is "1" bit in the write data, and is "0" in the written data. The memory control unit 470 rewrites the bit to be rewritten to "1". The processing is called as reset processing. Next, the memory control unit 470 compares the write data with the written data after set processing in a bit unit. An object to be rewritten is "0" bit in the write data, and is "1" in the written data. The memory control unit 470 rewrites the bit to be rewritten to "0". The processing is called as set processing.

Also, when the read command is received, the memory control unit 470 controls the address decoder 440 and the driver 430, and outputs the read data to the memory controller 300.

[Action Example of Storage]

Figure 12:
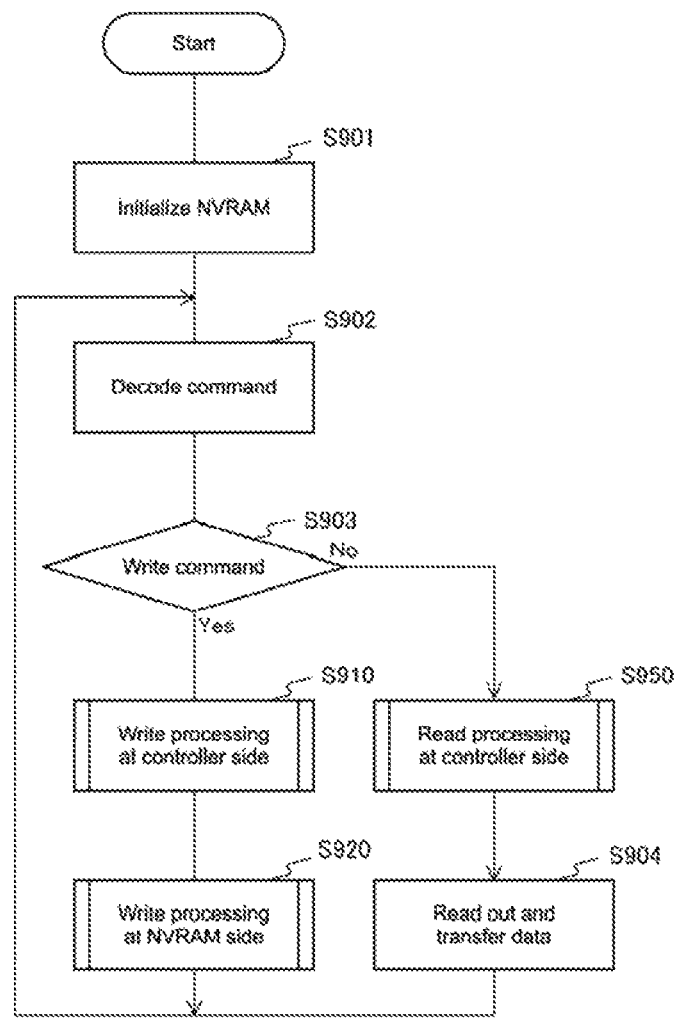
FIG. 12 is a flow chart showing an example of an action of a storage in a first embodiment.

FIG. 12 is a flow chart showing an example of an action of the storage 200 in a first embodiment. The action starts when initialization of the storage 200 is instructed by the host computer 100, for example.

The non-volatile memory 400 initializes all bits within the memory cell array 420 to a specific value (for example, "1") (Step S901). The memory controller 300 decodes a command from the host computer 100 (Step S902). When the memory controller 300 receives the command from the host computer 100, it is determined whether or not the command is a write command (Step S903). Here, the command from the host computer 100 is any of a write command and a read command. Although the non-volatile memory 400 initializes all bits to a value of "1", but it may initializes to a value of "0". In this case, the memory controller 300 may determine whether or not the bit of "0" exceeds n/2.

When it is the write command (Step S903: Yes), the memory controller 300 execute controller side write processing (Step S910). The non-volatile memory 400 executes NVRAM side write processing (Step S920).

On the other hand, when it is the read command (Step S903: No), the memory controller 300 executes controller side read processing (Step S950). Then, the non-volatile memory 400 reads out data, and transfers to the memory controller 300 (Step S904). After Step S920 or S904, the storage 200 returns to Step S902.

Figure 13:
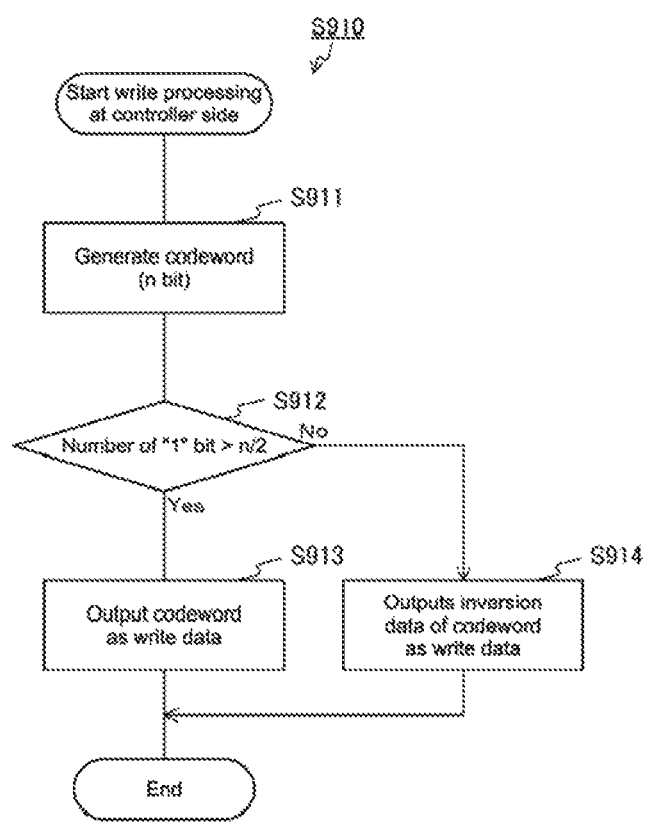
FIG. 13 is a flow chart showing an example of controller side write processing in a first embodiment.

FIG. 13 is a flow chart showing an example of controller side write processing in a first embodiment. The memory controller 300 generates a codeword of an n bit from the data to be encoded (Step S911). The memory controller 300 determines whether or not the number of the "1" bit within the codeword is greater than n/2 (Step S912).

When the number of the "1" bit is greater than n/2 (Step S912: Yes), the memory controller 300 outputs the codeword to the non-volatile memory 400 as the write data (Step S913). On the other hand, when the number of the "1" bit is n/2 or less (Step S912: No), the memory controller 300 outputs inversion data of the codeword as the write data (Step S914). After Step S912 or S914, the memory controller 300 ends the controller side write processing.

Figure 14:
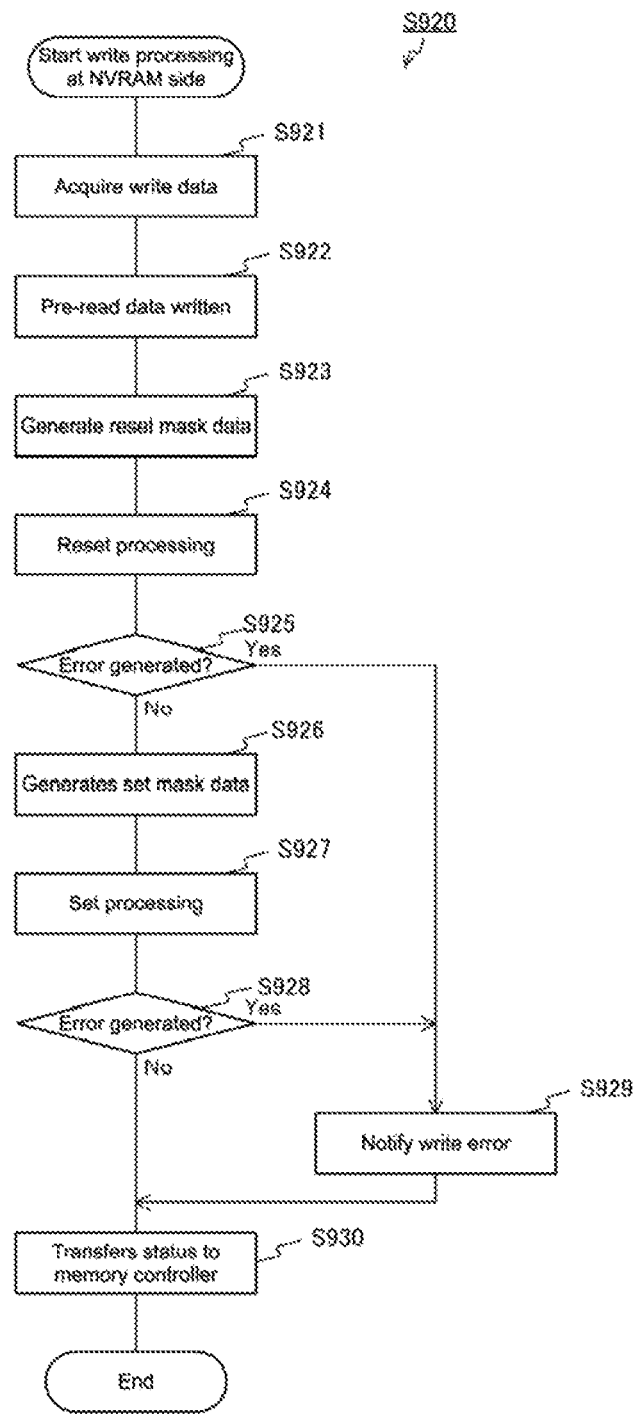
FIG. 14 is a flow chart showing an example of NVRAM side write processing in a first embodiment.

FIG. 14 is a flow chart showing an example of NVRAM side write processing in a first embodiment. The non-volatile memory 400 acquires write data (Step S921). The non-volatile memory 400 pre-reads the data written into the address of the writing destination (Step S922). The non-volatile memory 400 compares corresponding bits in the write data and the written data, and generates reset mask data (Step S923). The reset mask data shows that the bit that is "1" in the write data and "0" in the written data is reset, and that other bits are masked.

The non-volatile memory 400 performs processing for rewriting only the bits that will be reset shown by the reset mask data from "0" to "1" (reset processing) (Step S924). The non-volatile memory 400 reads out the written data after the reset processing, and determines whether or not a verify error is generated (Step S925).

When no verify error is generated (Step S925: No), the non-volatile memory 400 compares corresponding bits in the write data and the written data after the reset processing, and generates set mask data (Step S926). The set mask data shows that the bit that is "0" in the write data or redundant data and "1" in the written data is set, and that other bits are masked.

The non-volatile memory 400 performs processing for rewriting only the bits that will be set shown by the set mask data from "1" to "0" (set processing) (Step S927). The non-volatile memory 400 reads out the written data after the set processing, and determines whether or not a verify error is generated (Step S928).

When an error is generated in the reset processing (Step S925: Yes), or when an error is generated in the set processing (Step S928: Yes), the non-volatile memory 400 notifies the write error to the host computer 100 (Step S929). When no error is generated in the set processing (Step S928: No) or after Step S929, the non-volatile memory 400 transfers a status to the memory controller 300 (Step S930). After Step S930, the non-volatile memory 400 ends the write processing as an NVRAM side.

Figure 15:
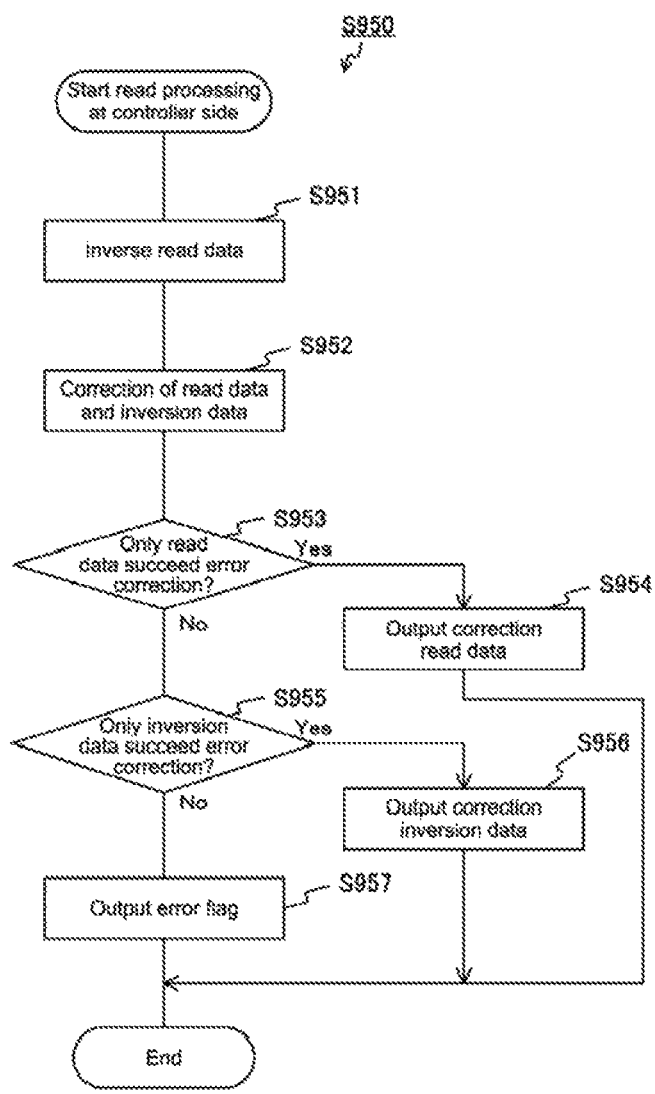
FIG. 15 is a flow chart showing an example of controller side read processing in a first embodiment.

FIG. 15 is a flow chart showing an example of controller side read processing in a first embodiment. The memory controller 300 inverses the read data to generate the read side inversion data (Step S951). Then, the memory controller 300 performs error detection and error correction of the read data and the read side inversion data (Step S952).

The memory controller 300 determines whether or not only the read data succeeds the error correction (Step S953). When only the read data succeeds the error correction (Step S953: Yes), the memory controller 300 outputs the correction read data to the host computer 100 (Step S954).

When only the read data does not succeed the error correction (Step S953: No), the memory controller 300 determines whether or not only the read side inversion data succeeds the error correction (Step S955). When only the read side inversion data succeeds the error correction (Step S955: Yes), the memory controller 300 outputs the correction inversion data to the host computer 100 (Step S956).

When only the read side inversion data does not succeed the error correction (Step S955: No), the memory controller 300 generates an error flag of "1", and outputs the error flag to the host computer 100 (Step S957). After Step S954, S956 or S957, the memory controller 300 ends the controller side read processing.

Thus, according to the first embodiment of the present technology, the memory controller 300 corrects the errors in both of the read data and the inversion data, and outputs the correction data in which the correction is succeeded. It is not necessary to hold in a memory an extra bit showing that whether or not the inversion is performed. In this manner, a utilization efficiency of the memory can be improved.

First Alternative Embodiment

In the first embodiment, the memory controller 300 determines that there is the read error when the corrections of both of the read data and the read side inversion data are succeeded. However, one of the correction data may be output without determining as the read error. For example, the write processing unit 310 inverses and writes when the number of the "1" bit is greater than n/2, it is high possibility that the correction read data Dr and the correction inversion data Dr having the greater number of "1" is right data. The memory controller 300 according to a first alternative embodiment is different from the first embodiment in that the one having the higher number of the bit having a specific value is output without determining as the read error when the corrections of both of the read data and the read side inversion data are succeeded.

Figure 16:
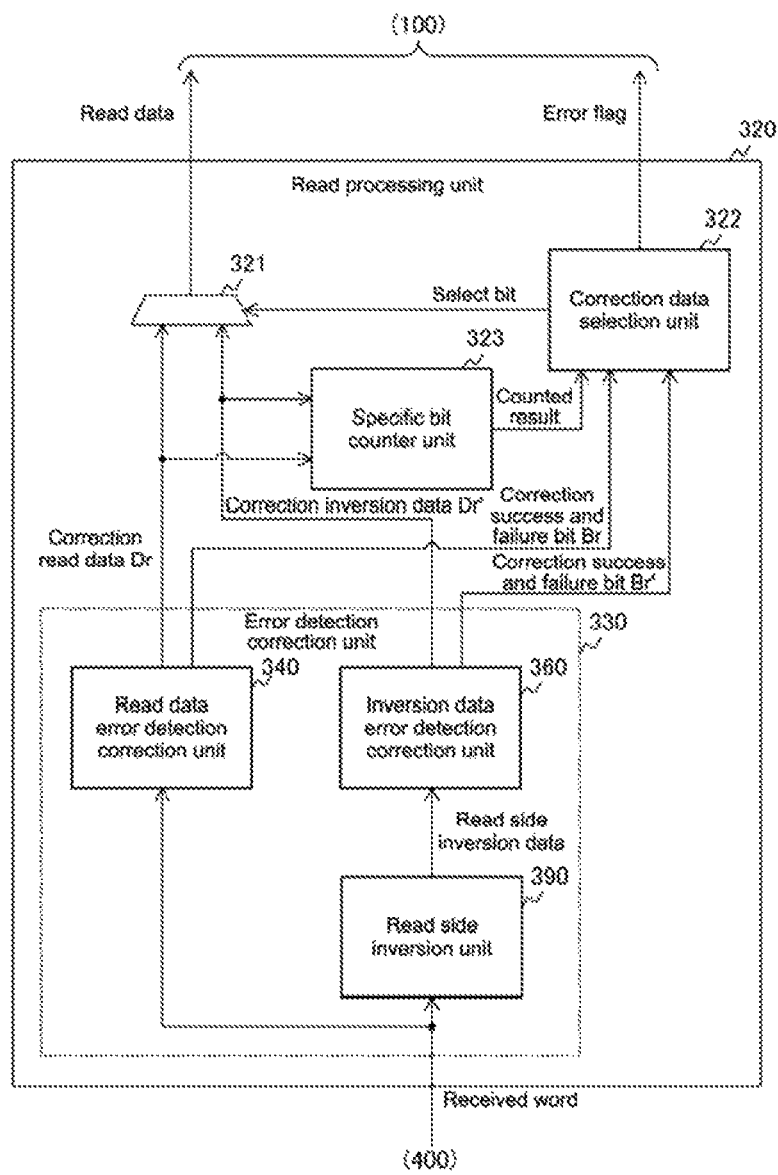
FIG. 16 is a block diagram showing a configuration example of a read processing unit in a first alternative embodiment of a first embodiment.

FIG. 16 is a block diagram showing a configuration example of the read processing unit 320 in a first alternative embodiment of a first embodiment. The read processing unit 320 in the first alternative embodiment is different from the first embodiment in that a specific bit counter unit 323 is further included.

The specific bit counter unit 323 counts the number of bits having a specific value (for example, "1") in each of the correction read data Dr and the correction inversion data Dr'. The specific bit counter unit 323 generates a bit showing that whether or not the correction read data Dr has the greater number of the "1" bit than the correction inversion data Dr', and feeds to the correction data selection unit 322 as a counted result.

The correction data selection unit 322 in the first alternative embodiment selects the correction read data Dr when the corrections of both of the read data and the read side inversion data are succeeded, and the correction read data Dr has the greater number of "1" than the correction inversion data Dr'. On the other hand, when the inversion data Dr' has the greater number of the "1" bit than the correction read data Dr, or when their numbers of bits the same, the correction data selection unit 322 selects the correction inversion data Dr'. When the corrections of both of the read data and the read side inversion data are succeeded, and the numbers of the "1" bit are the same in the correction read data and the correction inversion data Dr', the correction data selection unit 322 may determines as the read error.

Figure 17:
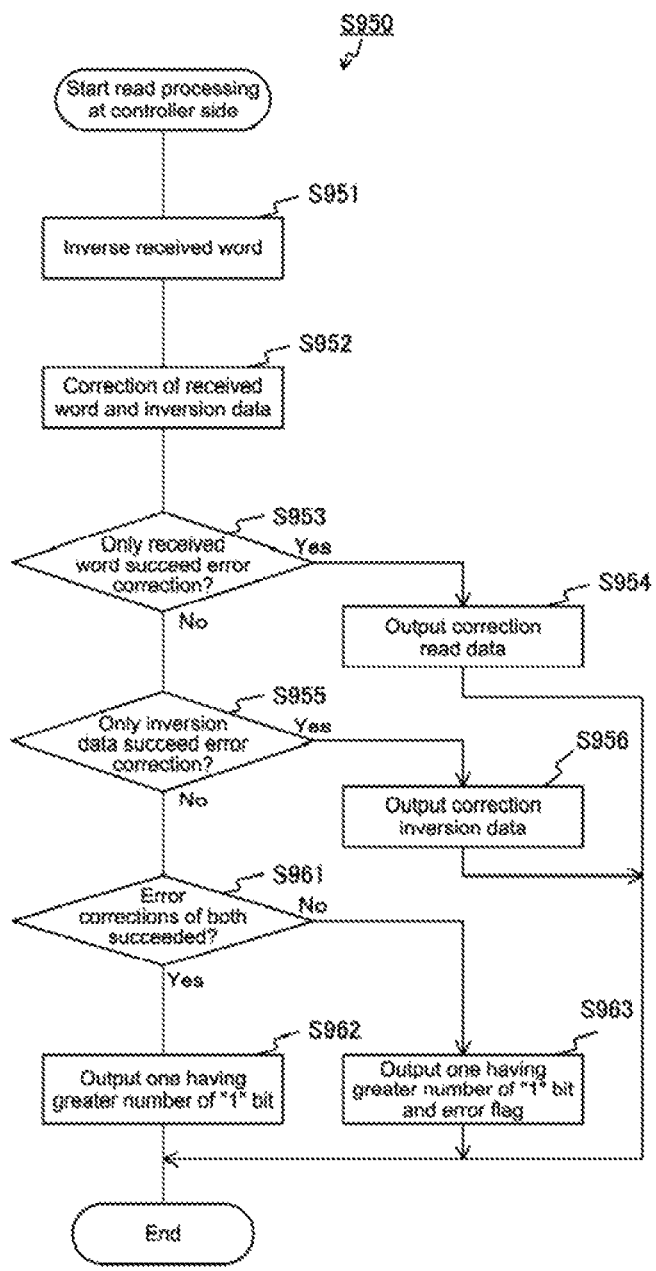
FIG. 17 is a flow chart showing an example of controller side read processing in a first alternative embodiment of a first embodiment.

FIG. 17 is a flow chart showing an example of controller side read processing in a first alternative embodiment of a first embodiment. The controller side read processing in the first alternative embodiment is different from the first embodiment in that no Step S957 is executed, and Steps S961 to S963 are further executed.

When only the read side inversion data does not succeed the error correction (Step S955: No), the memory controller 300 determines whether or not the error corrections of both of the read data and the read side inversion data are succeeded (Step S961). When the error corrections of both of the read data and the read side inversion data are succeeded (Step S961: Yes), the memory controller 300 outputs either of the Dr and Dr' having the greater number of the "1" bit. When the numbers of the "1" bit are the same, an error flag of "1" is generated as necessary (Step S962).

When the error corrections of both of the read data and the read side inversion data are not succeeded (Step S961: No), the memory controller 300 generates the error flag of "1", and outputs the error flag to the host computer 100. Also, the memory controller 300 outputs the read data or the read side inversion data having the number of the "1" bit to the host computer 100 as necessary (Step S963). After Step S954, S956, S962 or S963, the memory controller 300 ends the controller side read processing.

Thus, according to the first alternative embodiment, when the error corrections of both of the read data and the read side inversion data are succeeded, the memory controller 300 does not determine as the read error, and outputs either one having the greater number of the "1" bit, thereby decreasing an occurrence frequency of the read error.

Second Alternative Embodiment

In the first embodiment, although the memory controller 300 determines as the read error when the error corrections of both of the read data and the read side inversion data are succeeded, the correction data of the one may be output without determining as the read error. For example, it is high possibility that the data having the lower number of bits corrected may be right data. The memory controller 300 in a second alternative embodiment is different from the first embodiment in that the data having the lower number of bits corrected is output when the error corrections of both of the read data and the read side inversion data are succeeded.

The read processing unit 320 in the second alternative embodiment has the similar configuration as that in the first alternative embodiment. However, the correction data selection unit 322 in the second alternative embodiment determines whether or not the number of bits corrected of the read data Dr and the number of bits corrected of the correction inversion data Dr' are the same when the error corrections of both of the read data and read side inversion data are succeeded. When the number of bits corrected of the correction read data Dr and the number of bits corrected of the correction inversion data Dr' are the same, the correction data selection unit 322 outputs the one having the greater number of the "1" bit.

On the other hand, when the number of bits corrected of the correction read data Dr and the number of bits corrected of the correction inversion data Dr' are different, the correction data selection unit 322 outputs the one having the lower number of bits corrected.

Figure 18:
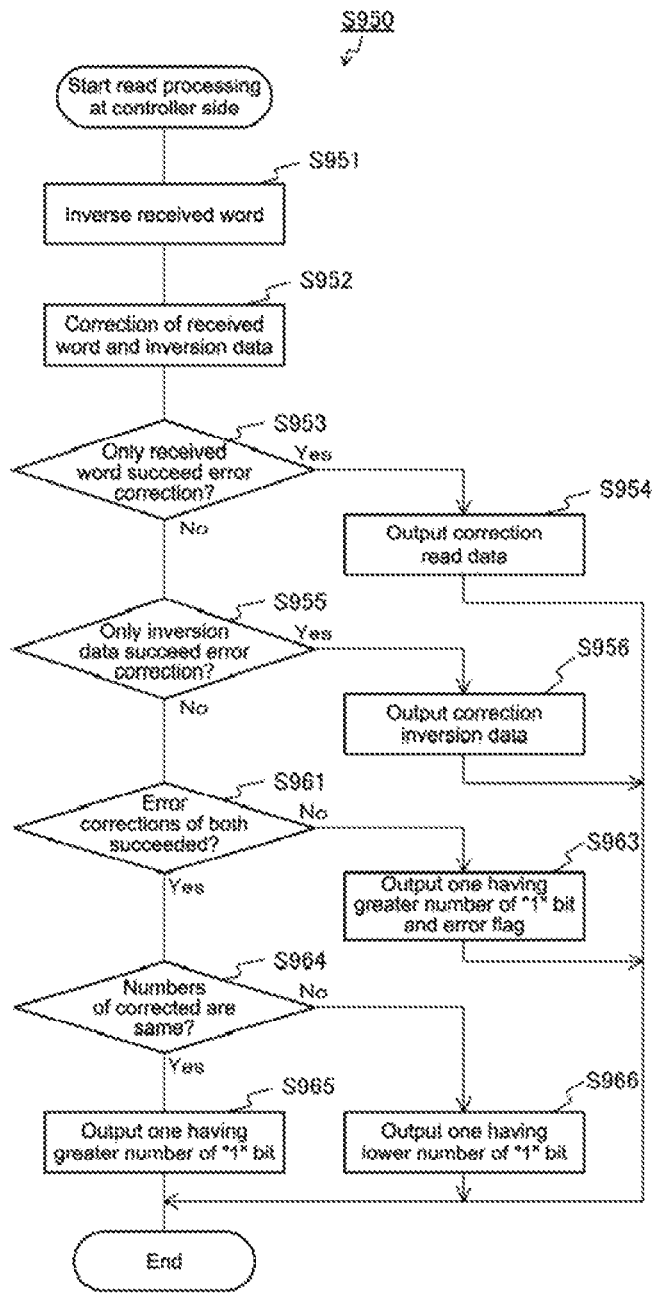
FIG. 18 is a flow chart showing an example of controller side read processing in a second alternative embodiment of a first embodiment.

FIG. 18 is a flow chart showing an example of controller side read processing in a second alternative embodiment of a first embodiment. The controller side read processing in the second alternative embodiment is different from the first alternative embodiment in that Step S962 is not executed, and Step S964 to S966 are further executed.

When the error corrections of both of the read data and the read side inversion data are succeeded (Step S961: Yes), the memory controller 300 determines whether or not the number of bits corrected of the Dr and the number of bits corrected of the Dr' are the same (Step S964). When the numbers of bits corrected are the same (Step S964: Yes), the memory controller 300 outputs one of the Dr and the Dr' having the greater number of the "1" bit to the host computer 100 (Step S965). On the other hand, when the numbers of bits corrected are not the same (Step S964: No), the memory controller 300 outputs the one having the lower number of the "1" bit to the host computer 100 (Step S966). After Step S954, S956, S963, S965 or S966, the memory controller 300 ends the controller side read processing.

According to the second alternative embodiment, when the error corrections of both of the read data and the read side inversion data are succeeded, the memory controller 300 does not determine as the read error, and outputs the one having the lower number of bits, thereby decreasing an occurrence frequency of the read error.

2. Second Embodiment

In the first embodiment, the syndromes S and S' are calculated from the read data and the read side inversion data, respectively. By applying simple operation to the syndrome S, the syndrome S' can be calculated. This allows to decrease a calculation amount. The memory controller 300 in the second embodiment is different from first embodiment in that the syndrome S' is determined by the simple operation.

Figure 19:
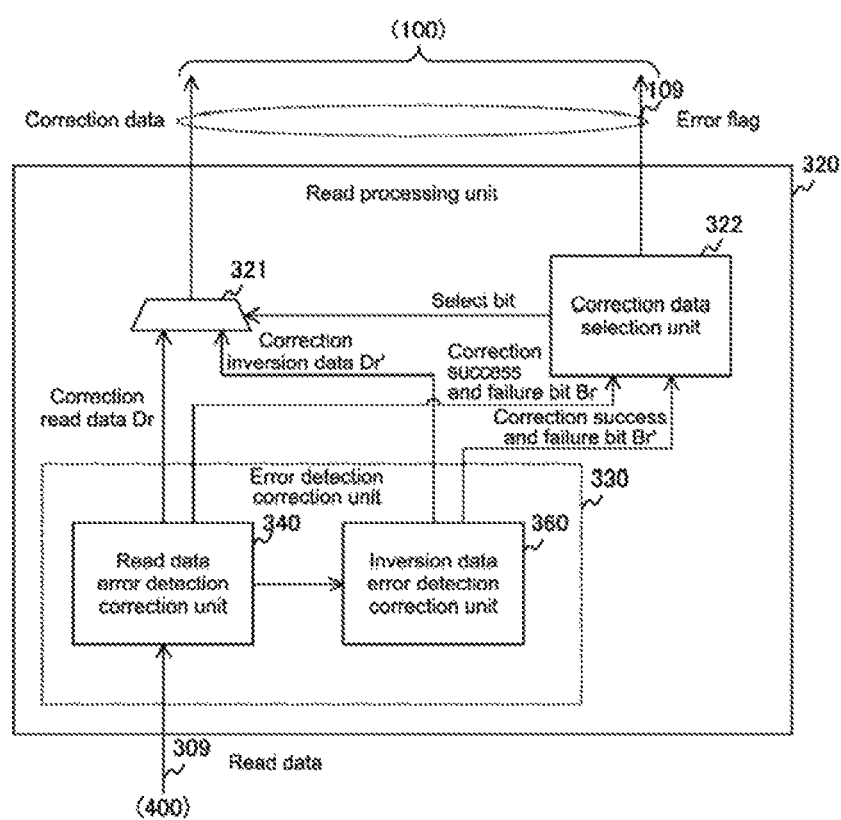
FIG. 19 is a block diagram showing a configuration example of a read processing unit in a second embodiment.

FIG. 19 is a block diagram showing a configuration example of the read processing unit 320 in the second embodiment. The read processing unit 320 in the second embodiment is different from the first embodiment in that the read side inversion unit 390 is disposed inside of the error detection correction unit 360.

In addition, the read data error detection correction unit 340 in the second embodiment feeds the syndrome S and the read data to the inversion data error detection correction unit 360. Also, the inversion data error detection correction unit 360 in the second embodiment calculates the S' on the basis of the syndrome S, and corrects the error in the inversion data on the basis of the syndrome S'.

Figure 20:
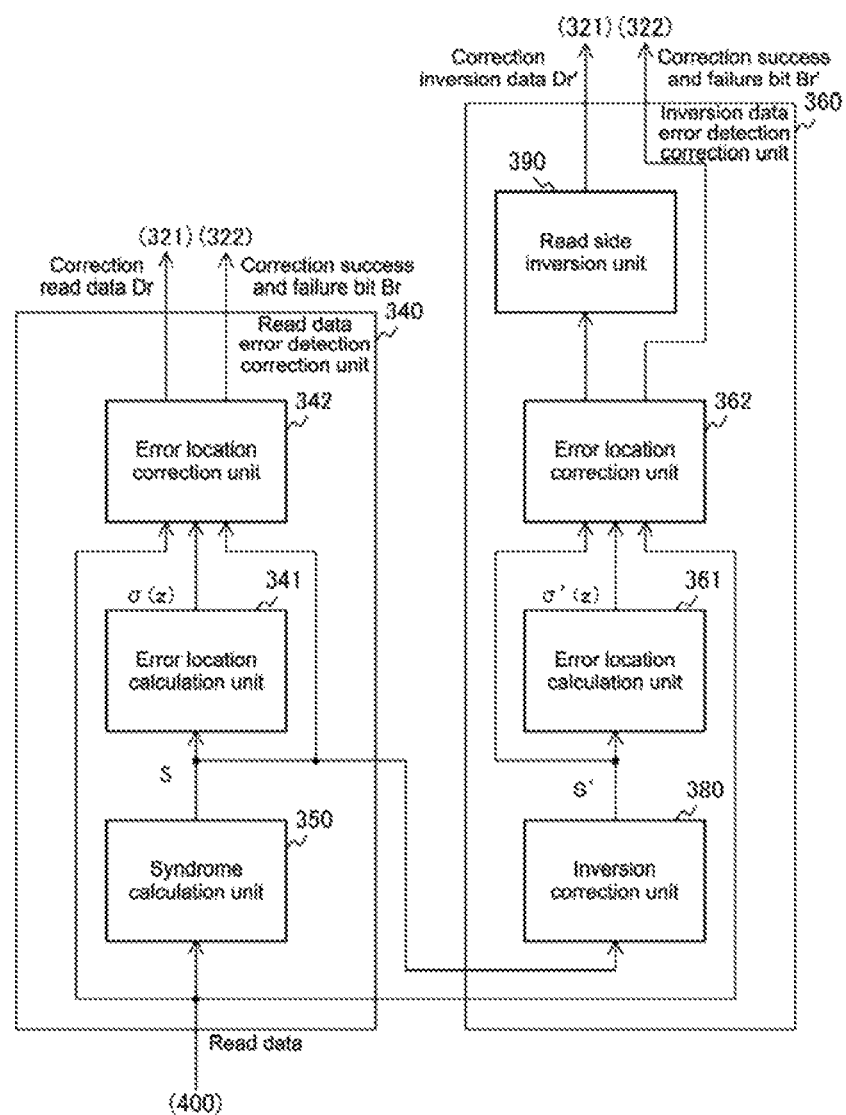
FIG. 20 is a block diagram showing a configuration example of a read data error detection correction unit and an inversion data error detection correction unit in a second embodiment.

FIG. 20 is a block diagram showing a configuration example of the read data error detection correction unit 340 and the inversion data error detection correction unit 360 in a second embodiment. The inversion data error detection correction unit 360 in the second embodiment is different from the first embodiment in that no syndrome calculation unit 370 is included, and the inversion compensation unit 380 and the read side inversion unit 390 are further included.

Firstly, the method of calculating the S' on the basis of the syndrome S is described by using a full-length BCH code. In this case, a codeword c*, an error pattern e*, and a received word r* are represented by the following respective expressions:

[Math. 16]

$$c^* = (c_{N-1}, c_{N-2}, \ldots, c_1, c_0) \qquad \text{Ex. 16}$$

[Math. 17]

$$e^* = (e_{N-1}, e_{N-2}, \ldots, e_1, e_0) \qquad \text{Ex. 17}$$

[Math. 18]

$$r^* = c^* + e^* = (r_{N-1}, r_{N-2}, \ldots, r_1, r_0) \qquad \text{Ex. 18}$$

The syndrome S* to the received word r* in the expression 18 is represented by the following expression:

[Math. 19]

$$S^* = H^* \cdot r^* \rightarrow \begin{pmatrix} S_1 \\ S_3 \\ \vdots \\ S_{2t-1} \end{pmatrix} = \begin{pmatrix} \alpha^{(N-1)\cdot 1} & \ldots & \alpha^1 & 1 \\ \alpha^{(N-1)\cdot 3} & \ldots & \alpha^3 & 1 \\ \vdots & \ldots & & \\ \alpha^{(N-1)\cdot(2t-1)} & \ldots & \alpha^{2t-1} & 1 \end{pmatrix} \begin{pmatrix} r_{N-1} \\ \vdots \\ r_1 \\ r_0 \end{pmatrix} \qquad \text{Ex. 19}$$

Here, a shortened code is a part of the full-length code, and a bit inversion of the codeword also leads to the codeword in the full-length code. The following relational expression is derived.

[Math. 20]

$$c^* = \begin{pmatrix} 0 \\ \vdots \\ 0 \\ c \end{pmatrix} \rightarrow \overline{c^*} = \begin{pmatrix} 1 \\ \vdots \\ 1 \\ \overline{c} \end{pmatrix} = c^* + \begin{pmatrix} 1 \\ \vdots \\ 1 \\ 1 \end{pmatrix} \qquad \text{Ex. 20}$$

[Math. 21]

$$r^* = \begin{pmatrix} 0 \\ \vdots \\ 0 \\ r \end{pmatrix} \rightarrow \overline{r^*} = \begin{pmatrix} 1 \\ \vdots \\ 1 \\ \overline{r} \end{pmatrix} = r^* + \begin{pmatrix} 1 \\ \vdots \\ 1 \\ 1 \end{pmatrix} \qquad \text{Ex. 21}$$

In the above expression, overbarred c* and r* represent vectors where c* and r* are inverted.

From the expressions 20 and 21, the following expression is derived.

[Math. 22]

$$H^* \cdot \bar{r}^* = H \cdot \bar{r} + H^* \cdot \begin{pmatrix} 1 \\ \vdots \\ 1 \\ 0 \end{pmatrix} = H^* \cdot \bar{c}^* + H^* \cdot e^* = 0 + S \quad \text{Ex. 22}$$

In the above expression, a product of H and overbarred r equals to the syndrome S' corresponding to the read side inversion data. Accordingly, the expression 22 derives that the syndrome S' corresponds to the vector where a compensation factor represented by the following expression is added to the syndrome S.

[Math. 23]

$$U = \begin{pmatrix} u_1 \\ u_3 \\ \vdots \\ u_{2t-1} \end{pmatrix} = H^* \cdot \begin{pmatrix} 1 \\ \vdots \\ 1 \\ 0 \end{pmatrix} \quad \text{Ex. 23}$$

In the above expression, a part from 0th to n−1 "0" represents a codeword coordinate, and a part from nth to the N−1th "1" represents a shortened coordinate.

The syndrome calculation unit 350 in the second embodiment further feeds the syndrome S calculated from the read data to the inversion compensation unit 380.

The inversion compensation unit 380 calculates the syndrome S' by adding the compensation factor in the expression 23 to the syndrome S. The inversion compensation unit 380 feeds the calculated syndrome S' to the error location calculation unit 361 and the error location correction unit 362.

The error location correction unit 362 in the second embodiment corrects the error in the read data, and feeds the correction read data to the read side inversion unit 390. The read side inversion unit 390 in the second embodiment inverts the data from the error location correction unit 362, and outputs the data as the correction inversion data Dr'.

Note that the error location correction unit 342 in the second embodiment is an example of a non-inverted side error location correction unit described in the scope of claims. Note that the error location correction unit 362 in the second embodiment is an example of an inverted side error location correction unit described in the scope of claims.

The inversion compensation method in the second embodiment is applicable to the BCH code defined by any finite degree, a correction number, a shortened code length.

Figure 21:
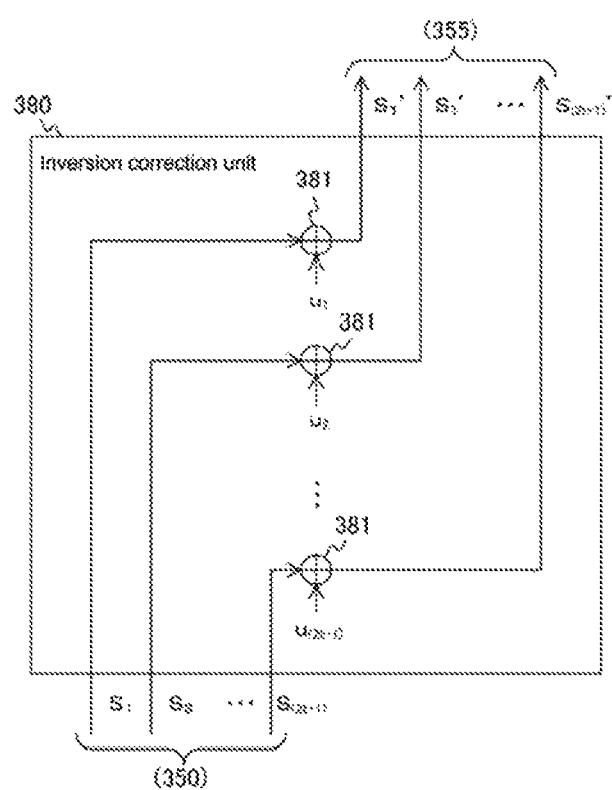
FIG. 21 is block diagram showing a configuration example of an inversion compensation unit in a second embodiment.

FIG. 21 is block diagram showing a configuration example of the inversion compensation unit 380 in a second embodiment. The inversion compensation unit 380 includes t adders 381.

The t-th adder 381 adds a compensation factor $u_t$ in the expression 23 to the component $S_i$ of the syndrome, and outputs as $S_i'$ in the syndrome S'.

According to the second embodiment, the memory controller 300 calculates the syndrome S' on the basis of the syndrome S by the simple operation that the compensation factor is added. This allows to decrease a calculation amount.

The above-described embodiments are illustrative to embody the present technology. The matters in the embodiments correspond to the matters specifying the invention in the claims. Similarly, the matters specifying the invention in the claims correspond to the matters in the embodiments of the present technology to which the same title is attached. Note that the present technology is not limited to the embodiments, and can be embodied by changing or alternating the embodiments variously without departing from the scope.

The processing sequences described in the above embodiments may be regarded as a method including a series of sequences, or may be regarded as a program to be executed by a computer for performing a series of sequence or a recording medium for storing the program. Examples of the recording medium include a CD (Compact Disc), an MD (MiniDisc), a DVD (Digital Versatile Disc), a memory card, a Blu-Ray™ disc and the like.

It should be noted that the effect described here is not necessarily limitative and may be any effect described in the present disclosure.

The present technology may have the following configurations.

(1) A memory controller, including:
  a codeword generation unit that generates a codeword in an error detection and correction code from data to be encoded;
  a write control unit that writes one of data obtained by inverting the codeword and the codeword into the memory cell as write data;
  a read data error correction unit that reads out the write data from the memory cell as read data, and corrects an error in the read data;
  an inversion data error correction unit that corrects an error in inversion data obtained by inverting the read data; and
  a correction data output unit that, when the number of errors of either only one of the read data and the inversion data does not exceed an error correction capability of the error detection and correction code, selects and outputs the one where the error is corrected as correction data.

(2) The memory controller according to (1), in which
  the read data error correction unit includes
  a non-inverted side syndrome calculation unit that calculates a product of the read data and a predetermined check matrix as a syndrome, and
  a non-inverted side error location correction unit that detects the error location on the basis of the syndrome, and corrects the location of the detected error in the read data, and
  the inversion data error correction unit includes
  an inversion compensation unit that compensates the syndrome by adding a compensation factor that is a difference between the product of the inversion data and the predetermined check matrix and the syndrome,
  an inverted side error location correction unit that detects the error location from the compensated syndrome, and corrects the location of the detected error in the read data, and
  an inversion unit that inverts the read data where the error is corrected by the inverted side error location correction unit.

(3) The memory controller according to any of (1) to (2), in which
the read data error correction unit detects the error location on the basis of the product of the read data and the predetermined check matrix, and corrects the detected error location in the read data, and
the inversion data error correction unit detects the error location on the basis of the product of the inversion data and the predetermined check matrix, and corrects the detected error location in the inversion data.

(4) The memory controller according to any of (1) to (3), in which
the write control unit writes one of the data obtained by inverting the codeword and the codeword as the write data, the one having a lower power consumption when writing into the memory cell.

(5) The memory controller according to (4), in which
the write control unit writes the codeword as the write data when the number of bits having a predetermined value in the codeword is greater than a half of a total number of bits of the codeword, and writes the data obtained by inverting the codeword as the write data when the number of bits having a predetermined value in the codeword does not exceed a half of the total number of bits of the codeword.

(6) The memory controller according to (5), when both of the numbers of errors of the read data and the number of errors of the inversion data do not exceed the error correction capability, one of correction read data where the error is corrected and correction inversion data where the error is corrected, the one having the greater number of bits having a predetermined value, is output as the correction data.

(7) The memory controller according to (5), when both of the number of errors of both of the read data and the number of errors of the inversion data do not exceed the error correction capability, one of correction read data where the error is corrected and correction inversion data where the error is corrected, the one having a lower number of errors corrected, is output as the correction data.

(8) The memory controller according to (7), when both of the number of errors of the read data and the number of errors of the inversion data do not exceed the error correction capability, and when the number of errors corrected of the correction read data and the number of errors of the correction inversion data are the same, one of the correction read data and the correction inversion data, the one having the greater number of bits having a predetermined value, is output as the correction data.

(9) A method of controlling a memory controller, including:
a codeword generation step of generating a codeword in an error detection and correction code from data to be encoded by a codeword generation unit;
a write control step of writing one of data obtained by inverting the codeword and the codeword into the memory cell as write data by a write control unit;
a read data error correction step of reading out the write data from the memory cell as read data, and correcting an error in the read data by a read data error correction unit;
an inversion data error correction step of correcting an error in inversion data obtained by inverting the read data by an inversion data error correction unit; and
a correction data output step of, when the number of errors of either only one of the read data and the inversion data does not exceed an error correction capability of the error detection and correction code, selecting the one where the error is corrected, and outputting as correction data by a correction data output unit.

REFERENCE SIGNS LIST 100 host computer
200 storage
300 memory controller
301 host interface
302 RAM
303 CPU
304 ECC processing unit
305 ROM
306 bus
307 memory interface
310 write processing unit
311 encoding unit
312 inversion determination unit
313 write side inversion unit
314, 321 selector
320 read processing unit
322 correction data selection unit
323 specific bit counter unit
330 error detection correction unit
340 read data error detection correction unit
341, 361 error location calculation unit
342, 362 error location correction unit
350, 370 syndrome calculation unit
351 syndrome component calculation unit
352 component output control unit
353 switch
360 inversion data error detection correction unit
380 inversion compensation unit
381 adder
390 read side inversion unit
400 non-volatile memory
410 data buffer
420 memory cell array
430 driver
440 address decoder
450 bus
460 control interface
470 memory control unit

The invention claimed is:
1. A memory controller, comprising:
a codeword generation unit configured to generate a codeword in an error detection and correction code, wherein the codeword is generated from data to be encoded;
a write side inversion unit configured to invert the codeword to obtain write side inversion data;
a write control unit configured to write one of the write side inversion data or the codeword into a memory cell as write data, based on a power consumption to write one of the write side inversion data or the codeword;
a read data error correction unit configured to:
read the write data from the memory cell as read data;
generate a first count of error locations associated with an error in the read data; and
correct the error in the read data;
an inversion data error correction unit configured to:
obtain inversion data generated by inversion of the read data;
generate a second count of error locations associated with an error in the inversion data; and
correct the error in the inversion data; and
a correction data output unit configured to:
output one of the read data or the inversion data in which the error is corrected as correction data, wherein the output is based on one of the first count of the error locations of the read data or the second count of the error locations of the inversion data that is less than an error correction capability of the error detection and correction code.

2. The memory controller according to claim 1, wherein the read data error correction unit includes:
   a non-inverted side syndrome calculation unit configured to calculate a product of the read data and a determined check matrix as a syndrome; and
   a non-inverted side error location correction unit configured to:
      detect the error locations associated with the error in the read data based on the syndrome; and
      correct the error locations associated with the error in the read data, and
   the inversion data error correction unit includes:
      an inversion compensation unit configured to compensate the syndrome by addition of a compensation factor to the syndrome, wherein the compensation factor is a difference between a product of the inversion data and the determined check matrix and the syndrome;
      an inverted side error location correction unit configured to:
         detect the error locations associated with the error in the read data based on the compensated syndrome; and
         correct the error locations in the read data; and
      a read side inversion unit configured to invert the read data, based on the corrected error locations in the read data.

3. The memory controller according to claim 1, wherein the read data error correction unit is further configured to:
   detect the error locations in the read data based on a product of the read data and a determined check matrix; and
   correct the detected error locations in the read data, and
   the inversion data error correction unit is further configured to:
      detect the error locations in the inversion data based on a product of the inversion data and the determined check matrix; and
      correct the detected error locations in the inversion data.

4. The memory controller according to claim 1, wherein the write control unit is further configured to:
   write the codeword as the write data based on a determination that a number of bits having a determined value in the codeword is greater than a half of a total number of bits of the codeword; and
   write the write side inversion data as the write data based on a determination that the number of bits having the determined value in the codeword is less than the half of the total number of bits of the codeword.

5. The memory controller according to claim 4, wherein the correction data output unit is further configured to output, based on both of the first count of the error locations of the read data and the second count of the error locations of the inversion data that are less than the error correction capability, one of the read data where the error is corrected or the inversion data where the error is corrected as the correction data, and
one of the read data where the error is corrected or the inversion data where the error is corrected which is output has a greater number of bits with the determined value.

6. The memory controller according to claim 4, wherein the correction data output unit is further configured to output, based on both of the first count of the error locations of the read data and the second count of the error locations of the inversion data that are less than the error correction capability, one of the read data where the error is corrected or the inversion data where the error is corrected as the correction data, and
one of the read data where the error is corrected or the inversion data where the error is corrected which is output has a lower number of errors corrected.

7. The memory controller according to claim 6, wherein the correction data output unit is further configured to output, based on both of the first count of the error locations of the read data and the second count of the error locations of the inversion data that are less than the error correction capability and based on the first count of the error locations of the read data and the second count of the error locations of the inversion data are the same, one of the read data or the inversion data as the correction data, and
one of the read data or the inversion data which is output has a greater number of bits with the determined value.

8. A method of controlling a memory controller, comprising:
   generating, by a codeword generation unit, a codeword in an error detection and correction code, wherein the codeword is generated from data to be encoded;
   inverting, by a write side inversion unit, the codeword to obtain write side inversion data;
   writing, by a write control unit, one of the write side inversion data or the codeword into a memory cell as write data, based on a power consumption to write one of the write side inversion data or the codeword;
   reading, by a read data error correction unit, the write data from the memory cell as read data;
   generating, by the read data error correction unit, a first count of error locations associated with an error in the read data;
   correcting, by the read data error correction unit, the error in the read data;
   obtaining, by an inversion data error correction unit, inversion data generated by inversion of the read data;
   generating, by the inversion data error correction unit, a second count of error locations associated with an error in the inversion data;
   correcting, by the inversion data error correction unit, the error in the inversion data; and
   outputting, by a correction data output unit, one of the read data or the inversion data in which the error is corrected, as correction data, wherein the output is based on one of the first count of the error locations of the read data or the second count of the error locations of the inversion data that is less than an error correction capability of the error detection and correction code.

* * * * *